(12) United States Patent
Funakawa et al.

(10) Patent No.: US 10,930,573 B2
(45) Date of Patent: Feb. 23, 2021

(54) CIRCUIT MODULE AND MANUFACTURING METHOD THEREFOR

(71) Applicant: Murata Manufacturing Co., Ltd., Kyoto (JP)

(72) Inventors: Shingo Funakawa, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 9 days.

(21) Appl. No.: 16/278,381

(22) Filed: Feb. 18, 2019

(65) Prior Publication Data

US 2019/0181068 A1 Jun. 13, 2019

Related U.S. Application Data

(63) Continuation of application No. PCT/JP2017/029439, filed on Aug. 16, 2017.

(30) Foreign Application Priority Data

Aug. 31, 2016 (JP) .............................. JP2016-169548

(51) Int. Cl.
*H01L 23/31* (2006.01)
*H01L 25/16* (2006.01)
(Continued)

(52) U.S. Cl.
CPC ........ *H01L 23/3142* (2013.01); *H01L 21/561* (2013.01); *H01L 23/3107* (2013.01);
(Continued)

(58) Field of Classification Search
CPC ............. H01L 23/3121; H01L 23/3128; H01L 2924/181; H01L 23/3142;
(Continued)

(56) References Cited

U.S. PATENT DOCUMENTS 8,349,721 B2 * 1/2013 Shim ...................... H01L 23/48
438/612
8,472,190 B2 * 6/2013 Refai-Ahmed ............................
H01L 23/49827
361/704
(Continued)

FOREIGN PATENT DOCUMENTS

JP H03-171652 A 7/1991
JP H06-216314 A 8/1994
(Continued)

OTHER PUBLICATIONS

International Search Report for International Application No. PCT/JP2017/029439 dated Oct. 24, 2017.
(Continued)

*Primary Examiner* — Scott B Geyer
(74) *Attorney, Agent, or Firm* — Pearne & Gordon LLP

(57) ABSTRACT

A circuit module includes a flat substrate, a frame substrate, a first electronic component, and a first sealing member. First connection electrodes are disposed at a peripheral portion of one main surface of the flat substrate. Second connection electrodes are disposed on one main surface of the frame substrate at locations corresponding to the first connection electrodes. Each of the first connection electrodes and a corresponding one of the second connection electrodes are connected to each other via a first connection member. The first electronic component is sealed by the first sealing member. The first electronic component and the first sealing member are disposed in a cavity defined by the one main surface of the flat substrate and an inner surface of the frame substrate. The first sealing member is separated from the inner surface of the frame substrate.

10 Claims, 11 Drawing Sheets

(51) Int. Cl.
*H05K 3/28* (2006.01)
*H01L 25/04* (2014.01)
*H01L 25/00* (2006.01)
*H05K 3/36* (2006.01)
*H05K 1/14* (2006.01)
*H01L 25/065* (2006.01)
*H01L 21/56* (2006.01)
*H01L 23/538* (2006.01)
*H01L 23/00* (2006.01)

(52) U.S. Cl.
CPC .......... *H01L 23/5383* (2013.01); *H01L 24/11* (2013.01); *H01L 25/04* (2013.01); *H01L 25/0652* (2013.01); *H01L 25/16* (2013.01); *H01L 25/50* (2013.01); *H05K 1/14* (2013.01); *H05K 3/28* (2013.01); *H05K 3/36* (2013.01); *H01L 23/3121* (2013.01); *H01L 2224/11009* (2013.01); *H01L 2224/16225* (2013.01); *H01L 2924/15153* (2013.01); *H01L 2924/17151* (2013.01); *H01L 2924/181* (2013.01)

(58) Field of Classification Search
CPC . H01L 2924/15151; H01L 2924/17151; H01L 2224/13111; H01L 2224/13611; H01L 2224/29111; H01L 2224/29611; H01L 23/28; H01L 23/31; H01L 23/3107; H01L 23/3114; H01L 2924/1811; H01L 2924/1815; H01L 2924/182; H01L 2924/15153
See application file for complete search history.

(56) References Cited

U.S. PATENT DOCUMENTS

| | | | | |
|---|---|---|---|---|
| 10,141,201 | B2 * | 11/2018 | Yu | H01L 23/5389 |
| 2002/0100977 | A1 * | 8/2002 | Kimura | H01L 24/12 |
| | | | | 257/738 |
| 2007/0053167 | A1 | 3/2007 | Ueda | |
| 2008/0042265 | A1 * | 2/2008 | Merilo | H01L 24/49 |
| | | | | 257/723 |
| 2008/0179725 | A1 * | 7/2008 | Chia | H01L 24/29 |
| | | | | 257/676 |
| 2009/0179319 | A1 * | 7/2009 | Lee | H01L 24/83 |
| | | | | 257/686 |
| 2009/0201656 | A1 * | 8/2009 | Shibuya | H01L 25/0657 |
| | | | | 361/782 |
| 2012/0081864 | A1 | 4/2012 | Sakurai et al. | |
| 2014/0151891 | A1 | 6/2014 | Takano et al. | |
| 2014/0264946 | A1 * | 9/2014 | Kim | H01L 24/82 |
| | | | | 257/777 |
| 2014/0268587 | A1 | 9/2014 | Nomura et al. | |
| 2015/0235990 | A1 * | 8/2015 | Cheng | H01L 25/03 |
| | | | | 257/712 |
| 2015/0279759 | A1 * | 10/2015 | Miyakoshi | H01L 23/3677 |
| | | | | 257/738 |
| 2017/0047266 | A1 * | 2/2017 | Ihara | H01L 23/367 |

FOREIGN PATENT DOCUMENTS

| | | |
|---|---|---|
| JP | 2000-12575 A | 1/2000 |
| JP | 2003-69179 A | 3/2003 |
| JP | 2007-73849 A | 3/2007 |
| JP | 2008-153307 A | 7/2008 |
| JP | 2012-212831 A | 11/2012 |
| JP | 2014-112606 A | 6/2014 |
| JP | 2014-179472 A | 9/2014 |
| WO | 2007/116544 A1 | 10/2007 |

OTHER PUBLICATIONS

Written Opinion for International Application No. PCT/JP2017/029439 dated Oct. 24, 2017.

* cited by examiner

CIRCUIT MODULE AND MANUFACTURING METHOD THEREFOR

This is a continuation of International Application No. PCT/JP2017/029439 filed on Aug. 16, 2017 which claims priority from Japanese Patent Application No. 2016-169548 filed on Aug. 31, 2016. The contents of these applications are incorporated herein by reference in their entireties.

BACKGROUND OF THE DISCLOSURE

Field of the Disclosure

The disclosure relates to a circuit module and a manufacturing method for the circuit module and, more particularly, to a circuit module in which a flat substrate and a frame substrate are connected to each other, and a manufacturing method for the circuit module.

Description of the Related Art

Miniaturization of electronic components that are used in mobile communication devices, such as cellular phones, has been pursued to enhance packing density on circuit boards of electronic devices. As for miniaturization of electronic components, it is effective to modularize a plurality of electronic components in advance as a single electronic component. An example of this is a circuit module described in Japanese Unexamined Patent Application Publication No. 6-216314 (Patent Document 1).

FIG. 17 is a cross-sectional view of a circuit module 200 described in Patent Document 1. The circuit module 200 includes a flat substrate 210, a frame substrate 220, and electronic components 217, 218. Terminal electrodes 229 on the frame substrate 220 are connected to connection electrodes 214 provided on one main surface (the lower surface in the drawing) side of the flat substrate 210. The electronic components 218 are connected to the other main surface (the upper surface in the drawing) side of the flat substrate 210.

The electronic component 217 is located in a cavity defined by the one main surface of the flat substrate 210 and an inner surface of the frame substrate 220, and is sealed by a sealing member 230. The sealing member 230 is filled in the cavity. Since the electronic component 217 is sealed by the sealing member 230, adhesion, or the like, of solder balls and flux residues to the electronic component 217 is reduced at the time when the circuit module 200 is connected to a circuit board by reflowing. That is, a short-circuit failure of the circuit module 200 after the circuit module 200 is connected to a circuit board is reduced, and it is also possible to enhance long-term reliability.

Patent Document 1: Japanese Unexamined Patent Application Publication No. 6-216314 Non Patent Literature

BRIEF SUMMARY OF THE DISCLOSURE

In the circuit module 200, after the flat substrate 210 and the frame substrate 220 are connected to each other, the sealing member 230 is filled in the cavity, so the sealing member 230 definitely contacts with the inner surface of the frame substrate 220. In general, a liquid sealing member shrinks in volume at the time when the liquid sealing member solidifies. Therefore, in a manufacturing process for the circuit module 200, at the time when the liquid sealing member 230 solidifies, the inner surface of the frame substrate 220 is pulled inward by the shrinkage of the sealing member 230. That is, shear stress occurs between the flat substrate 210 and the frame substrate 220. As a result, a connection member between each of the connection electrodes 214 on the flat substrate 210 and a corresponding one of the terminal electrodes 229 on the frame substrate 220 may possibly break.

Assuming the case where the coefficient of thermal expansion of the frame substrate 220 and the coefficient of thermal expansion of the sealing member 230 differ from each other in a state where the frame substrate 220 and the sealing member 230 are in contact with each other. For example, when the coefficient of thermal expansion of the sealing member 230 is larger, the inner surface of the frame substrate 220 is pushed outward by the volume expansion of the sealing member 230 at the time when the circuit module 200 is connected to a circuit board of an electronic device by reflowing. In this case, opposite shear stress from the above occurs between the flat substrate 210 and the frame substrate 220. As a result, as in the case of the above, the connection member between each of the connection electrodes 214 on the flat substrate 210 and a corresponding one of the terminal electrodes 229 on the frame substrate 220 may possibly break.

It is an object of the disclosure to provide a circuit module having a highly reliable connection between a flat substrate and a frame substrate, and a manufacturing method for the circuit module.

The disclosure improves, in a circuit module including a flat substrate, a frame substrate, and a sealing member and a manufacturing method for the circuit module, the shape of the sealing member and a method of forming the sealing member.

First, the disclosure is directed to a circuit module.

The circuit module according to the disclosure includes a flat substrate, a frame substrate, a first electronic component, and a first sealing member, which have the following characteristics. A plurality of first connection electrodes are disposed at a peripheral portion of one main surface of the flat substrate. A plurality of second connection electrodes are disposed on one main surface of the frame substrate at locations corresponding to the first connection electrodes. Each of the first connection electrodes and a corresponding one of the second connection electrodes are connected to each other via a first connection member. The first electronic component is sealed by the first sealing member.

The first electronic component and the first sealing member are disposed in a cavity defined by the one main surface of the flat substrate and an inner surface of the frame substrate. The first sealing member is separated from the inner surface of the frame substrate.

With the circuit module having the above-described configuration, the frame substrate and the first sealing member are not in contact with each other. For this reason, at the time when the first sealing member is cured or at the time when the circuit module is connected to a circuit board of an electronic device by reflowing, no shear stress caused by the above-described action develops between the flat substrate and the frame substrate. Therefore, the first connection members between the flat substrate and the frame substrate do not break, and the electrical and mechanical connections between the flat substrate and the frame substrate are highly reliable.

The circuit module according to the disclosure preferably includes the following characteristics. That is, the first sealing member contains a photo-curing resin material.

With the circuit module having the above-described configuration, the shape of the first sealing member is formed so as to be separated from the inner surface of the frame substrate with high precision depending on the precision of a mask pattern for exposure to light.

The circuit module according to the disclosure and a preferred embodiment of the circuit module preferably include the following characteristics. That is, the first connection member contains a metal material having a melting point of 900 degrees C. or higher.

With the circuit module having the above-described configuration, the melting point of the first connection member is sufficiently high as compared to a reflowing temperature at the time when the circuit module is connected onto a circuit board of an electronic device. Therefore, the first connection member does not remelt at the time of reflowing, and the breaking strength of the first connection member is also high, so the electrical and mechanical connections between the flat substrate and the frame substrate are highly reliable.

The circuit module according to the disclosure and a preferred embodiment of the circuit module also preferably include the following characteristics. That is, the first connection member contains an anisotropic conductive resin material, and seals a corresponding one of the first connection electrodes and a corresponding one of the second connection electrodes.

With the circuit module having the above-described configuration, the first connection member is disposed so as to seal a corresponding one of the first connection electrodes and a corresponding one of the second connection electrodes, and serves as an underfill between the one main surface of the flat substrate and the one main surface of the frame substrate. That is, the first connection member not only electrically connects a corresponding one of the first connection electrodes and a corresponding one of the second connection electrodes to each other but also mechanically connects the flat substrate and the frame substrate to each other. Therefore, the electrical and mechanical connections between the flat substrate and the frame substrate are further highly reliable.

The circuit module according to the disclosure and a preferred embodiment of the circuit module also preferably include the following characteristics. That is, the first connection member contains a metal material containing Sn, and the first connection member, a corresponding one of the first connection electrodes, and a corresponding one of the second connection electrodes are sealed by an electrically insulating resin member.

With the circuit module having the above-described configuration, the first connection member containing a metal material containing Sn plays a role in the electrical connection between a corresponding one of the first connection electrodes and a corresponding one of the second connection electrodes. Examples of the metal material containing Sn include an Sn—Ag—Cu-based Pb-free solder material. The electrically insulating resin member is disposed so as to seal a corresponding one of the first connection electrodes, a corresponding one of the second connection electrodes, and the corresponding first connection member, so the electrically insulating resin member serves as an underfill between the one main surface of the flat substrate and the one main surface of the frame substrate. Therefore, the electrical and mechanical connections between the flat substrate and the frame substrate are further highly reliable.

The circuit module according to the disclosure, a preferred embodiment of the circuit module, and a further preferred embodiment of the circuit module preferably include the following characteristics. That is, a metal film is disposed on a surface of the first sealing member opposite to a surface of the first sealing member facing to the one main surface of the flat substrate.

With the circuit module having the above-described configuration, at the time when the circuit module is connected to a circuit board of an electronic device by reflowing, the metal film is also connected to a connection electrode on the circuit board of the electronic device in addition to input and output electrodes and grounding electrodes of the circuit module. That is, the connection portions between the circuit module and the circuit board of the electronic device increase. Therefore, the mechanical connection is highly reliable.

In addition, it is possible to efficiently dissipate the heat to the circuit board of the electronic device through the metal film when the heat is generated from the first electronic component during the operation of the circuit module.

That is, the damage due to the self-heating of the first electronic component is reduced. Therefore, the lifetime reliability of the circuit module is improved.

The disclosure is also directed to a manufacturing method for a circuit module.

The manufacturing method for a circuit module according to the disclosure is intended to manufacture a circuit module including a flat substrate, a frame substrate, a first electronic component, and a first sealing member. The circuit module has the following characteristics. A plurality of first connection electrodes are disposed at a peripheral portion of one main surface of the flat substrate. A plurality of second connection electrodes are disposed on one main surface of the frame substrate at locations corresponding to the first connection electrodes. Each of the first connection electrodes and a corresponding one of the second connection electrodes are connected to each other via a first connection member. The first electronic component is sealed by the first sealing member. The manufacturing method for a circuit module according to the disclosure includes the following four processes.

A first process is a process of preparing the flat substrate and the frame substrate. A second process is a process of connecting the first electronic component onto the one main surface of the flat substrate.

A third process is a process of forming the first sealing member on the one main surface of the flat substrate. In the following fourth process, a cavity defined by the one main surface of the flat substrate and an inner surface of the frame substrate is defined by connecting each of the first connection electrodes and a corresponding one of the second connection electrodes to each other. In the third process, at this time, the first sealing member is formed such that the first sealing member seals the first electronic component and the first sealing member has a predetermined shape so as to be separated from the inner surface of the frame substrate. The fourth process is a process of connecting each of the first connection electrodes and a corresponding one of the second connection electrodes via the first connection member.

With the manufacturing method for a circuit module, having the above-described processes, the first sealing member having the predetermined shape is formed in first. After that, each of the first connection electrodes and a corresponding one of the second connection electrodes are connected to each other via the first connection member. Therefore, it is possible to reliably separate the first sealing member from the inner surface of the frame substrate, and, by extension, highly reliably connection between the flat substrate and the frame substrate is achieved.

The manufacturing method for a circuit module according to the disclosure preferably has the following characteristics. That is, the first sealing member contains a photo-curing resin material. The third process includes the following two sub-processes.

A first sub-process is a process of putting a photo-curing precursor for the first sealing member on the one main surface. A second sub-process is a process of forming the first sealing member having the predetermined shape by exposing the photo-curing precursor for the first sealing member to light.

With the manufacturing method for a circuit module, including the above-described processes, the first sealing member is cured without heating or by heating at a low temperature. Therefore, it is possible to reduce thermal damage to the first electronic component that is sealed by the first sealing member. In addition, with the manufacturing method for a circuit module, including the above-described processes, it is also possible to form the shape of the first sealing member such that the first sealing member is separated from the inner surface of the frame substrate with high precision depending on the precision of a mask pattern for exposure to light.

The manufacturing method for a circuit module according to the disclosure preferably includes the following characteristics. That is, the first sealing member contains a thermosetting resin material. The third process includes the following five sub-processes.

A first sub-process is a process of putting a photo-curing precursor for a resist member on the one main surface. A second sub-process is a process of forming the resist member having a shape that is a negative pattern of the predetermined shape by exposing the photo-curing precursor for the resist member to light. A third sub-process is a process of putting a thermosetting precursor for the first sealing member on the one main surface on which the resist member is provided. A fourth sub-process is a process of forming the first sealing member having the predetermined shape by heating the thermosetting precursor for the first sealing member. A fifth sub-process is a process of peeling the resist member from the one main surface.

With the manufacturing method for a circuit module, including the above-described processes, a low-cost thermosetting resin material may be used as the first sealing member. Therefore, the cost for manufacturing the circuit module is kept low.

The manufacturing method for a circuit module according to the disclosure and a preferred embodiment of the manufacturing method preferably include the following characteristics. That is, the third process further includes a sub-process of disposing a metal film on a surface of the first sealing member opposite to a surface of the first sealing member facing to the one main surface of the flat substrate.

With the manufacturing method for a circuit module, including the above-described processes, it is possible to manufacture the circuit module having a large number of connection portions with a circuit board of an electronic device and highly reliable mechanical connection.

The manufacturing method for a circuit module according to the disclosure and a preferred embodiment of the manufacturing method preferably include the following characteristics. That is, the fourth process includes the following three sub-processes.

A first sub-process is a process of putting metal material paste containing nanoparticles of a metal material having a melting point of 900 degrees C. or higher on at least one of each of the first connection electrodes and each of the second connection electrodes. A second sub-process is a process of facing each of the first connection electrodes and a corresponding one of the second connection electrodes to each other with the metal material paste interposed between each of the first connection electrodes and the corresponding one of the second connection electrodes. A third sub-process is a process of forming the first connection member sintered by heating the metal material paste, the first connection member containing a metal material having a melting point of 900 degrees C. or higher and electrically connecting each of the first connection electrodes and a corresponding one of the second connection electrodes to each other.

With the manufacturing method for a circuit module, having the above-described processes, each of the first connection electrodes and a corresponding one of the second connection electrodes are electrically connected to each other by using a metal material paste containing nanoparticles of a metal material having a melting point of 900 degrees C. or higher. Examples of the above-described metal material paste include Ag (melting point: approximately 962 degrees C.) nanoparticle paste; however, the metal material paste is not limited to this paste.

When the above-described metal material paste is, for example, Ag nanoparticle paste, the metal material paste has a sintering temperature of approximately 180 degrees C. that is lower by 50 degrees or more than that of solder paste that is generally used in various connections. Therefore, with the manufacturing method for a circuit module, including the above-described processes, it is possible to reduce thermal damage to the first electronic component.

In addition, since the melting point of the sintered first connection member is higher than or equal to 900 degrees C., the first connection member does not remelt at the time when the circuit module is connected to a circuit board of an electronic device by reflowing using solder paste. Therefore, with the manufacturing method for a circuit module, including the above-described processes, the electrical and mechanical connections between the flat substrate and the frame substrate are highly reliable.

The manufacturing method for a circuit module according to the disclosure and a preferred embodiment of the manufacturing method also preferably include the following characteristics. That is, the fourth process includes the following three sub-processes.

A first sub-process is a process of putting liquid resin containing an uncured anisotropic conductive resin material on at least one of each of the first connection electrodes and each of the second connection electrodes. A second sub-process is a process of pressurizing the liquid resin between each of the first connection electrodes and a corresponding one of the second connection electrodes and additionally burying each of the first connection electrodes and a corresponding one of the second connection electrodes in the liquid resin by facing each of the first connection electrodes and a corresponding one of the second connection electrodes to each other with the liquid resin interposed between each of the first connection electrodes and the corresponding one of the second connection electrodes and relatively displacing each of the first connection electrodes and a corresponding one of the second connection electrodes in a direction to approach each other.

A third sub-process is a process of forming the first connection member cured by heating the liquid resin, the first connection member electrically connecting a corresponding one of the first connection electrodes and a corresponding one of the second connection electrodes to each other, the first connection member sealing a corresponding one of the first connection electrodes and a corresponding one of the second connection electrodes.

With the manufacturing method for a circuit module, including the above-described processes, electrical conductivity is obtained by pressurizing the liquid resin containing an uncured anisotropic conductive resin material in a region between each of the first connection electrodes and a corresponding one of the second connection electrodes. On the other hand, electrical insulation is obtained in a region that surrounds each of the first connection electrodes and a corresponding one of the second connection electrodes and that is not pressurized. That is, with the manufacturing method for a circuit module, including the above-described processes, a region that electrically connects each of the first connection electrodes and a corresponding one of the second connection electrodes to each other and a region that serves as an underfill are formed by using one liquid resin.

Therefore, with the manufacturing method for a circuit module, including the above-described processes, it is possible to easily manufacture the circuit module having highly reliable electrical and mechanical connections between the flat substrate and the frame substrate at low cost.

The manufacturing method for a circuit module according to the disclosure and a preferred embodiment of the manufacturing method also preferably include the following characteristics. That is, the fourth process includes the following three sub-processes.

A first sub-process is a process of putting a metal material bump containing a metal material containing Sn on one of each of the first connection electrodes and each of the second connection electrodes, and putting liquid resin containing an uncured electrically insulating resin material on the other one of each of the first connection electrodes and each of the second connection electrodes. A second sub-process is a process of bringing the metal material bump into contact with the other one of each of the first connection electrodes and each of the second connection electrodes, on which the liquid resin is put, and burying the metal material bump, a corresponding one of the first connection electrodes, and a corresponding one of the second connection electrodes in the liquid resin.

A third sub-process is a process of forming the first connection member by applying ultrasonic vibrations to the metal material bump, the first connection member electrically connecting a corresponding one of the first connection electrodes and a corresponding one of the second connection electrodes to each other, and forming an electrically insulating resin member cured by heating the liquid resin, the electrically insulating resin member sealing a corresponding one of the first connection electrodes, a corresponding one of the second connection electrodes, and the corresponding first connection member.

With the manufacturing method for a circuit module, including the above-described processes, forming the first connection member is not accompanied by heating. Therefore, it is possible to reduce thermal damage to the first electronic component. In addition, each of the first connection electrodes, a corresponding one of the second connection electrodes, and the corresponding first connection member are buried in the electrically insulating resin member, and the electrically insulating resin member serves as an underfill. Therefore, with the manufacturing method for a circuit module, including the above-described processes, it is possible to manufacture the circuit module having highly reliable mechanical connection between the flat substrate and the frame substrate.

With the circuit module according to the disclosure, connection members between the flat substrate and the frame substrate do not break, and the connection between the flat substrate and the frame substrate is highly reliable.

In addition, with the manufacturing method for a circuit module according to the disclosure, it is possible to reliably separate the first sealing member from the inner surface of the frame substrate, and, by extension, the connection between the flat substrate and the frame substrate is highly reliable.

DETAILED DESCRIPTION OF THE DISCLOSURE

Hereinafter, characteristics of the disclosure will be described in more detail by exemplifying embodiments of the disclosure. Examples of a circuit module to which the disclosure is applied include a hybrid integrated circuit that is used in a mobile communication device, such as a cellular phone; however, the circuit module is not limited to the hybrid integrated circuit.

First Embodiment of Circuit Module

Structure of Circuit Module

Figure 2:
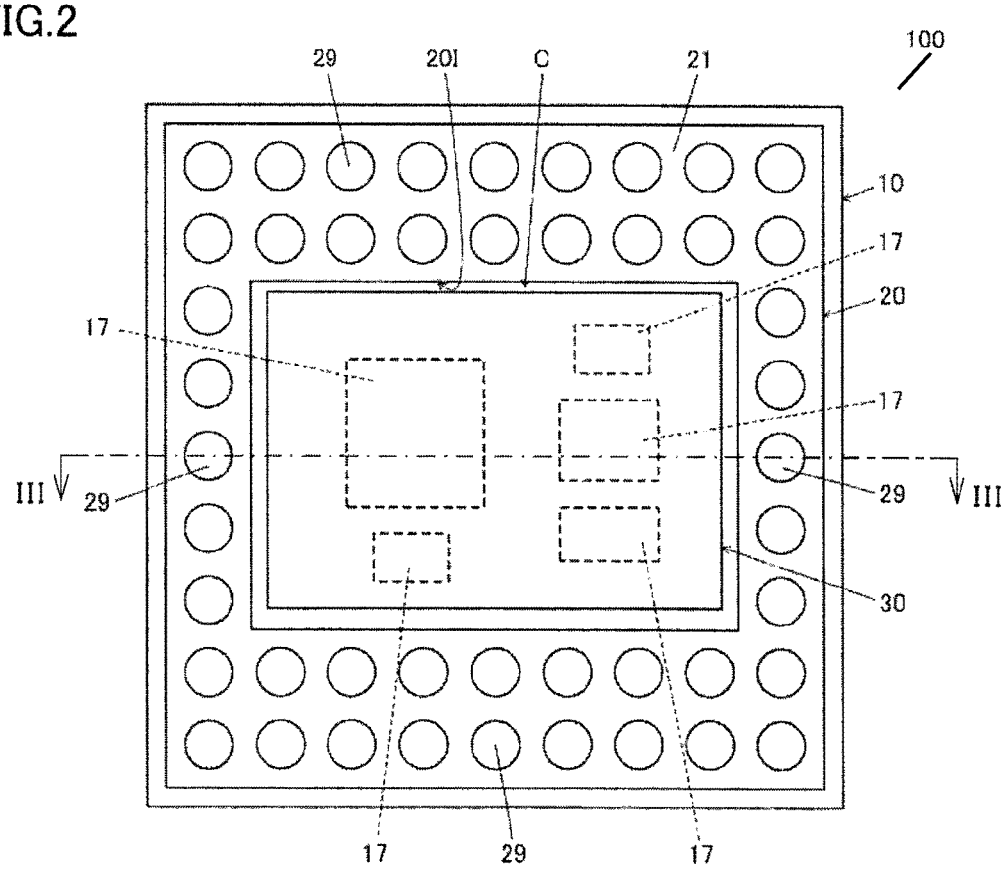
FIG. 2 is an external view of the circuit module 100 when viewed in the arrow direction indicated in FIG. 1.
Figure 3:
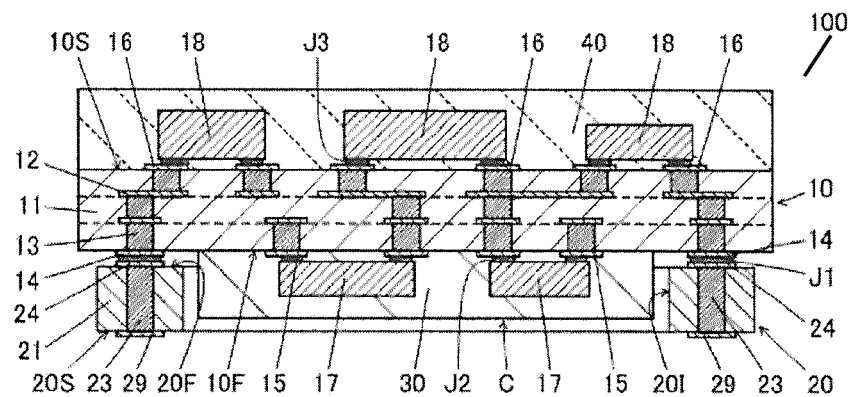
FIG. 3 is a cross-sectional view of the circuit module 100, taken along the line III-III in FIG. 2.

The structure of a circuit module 100 that is a first embodiment of the circuit module according to the disclosure will be described with reference to FIG. 1 to FIG. 3. The drawings are schematic views, and do not always reflect the dimensions of an actual product. Variations in the shape of each element, and the like, which occur in a manufacturing process, are also not always reflected in the drawings. That is, the drawings that will be used below may be regarded as showing an actual product in essential terms even when there are portions different from the actual product.

Figure 1:
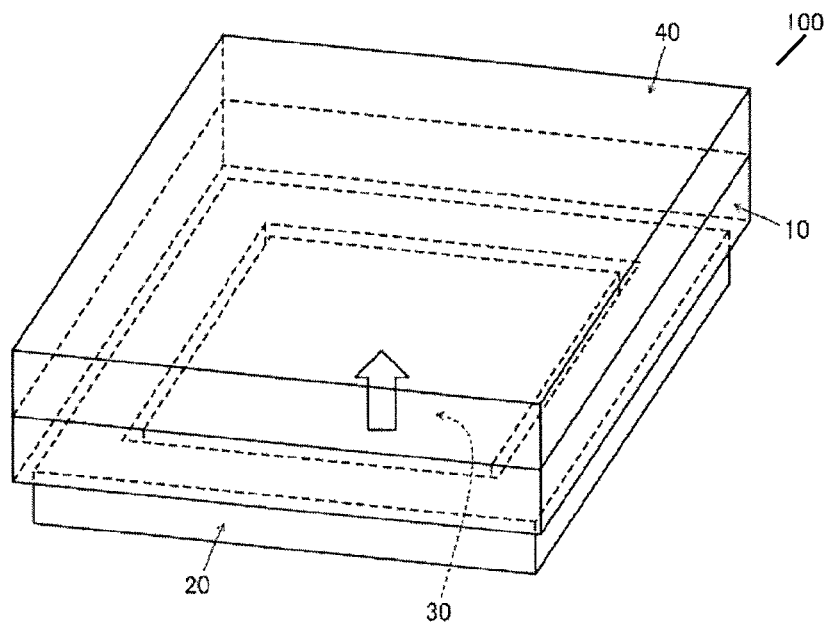
FIG. 1 is an external perspective view of a circuit module 100 that is a first embodiment of a circuit module according to the disclosure.

FIG. 1 is an external perspective view of the circuit module 100. FIG. 2 is an external view (so-called bottom view) of the circuit module 100 when viewed in the arrow direction indicated in FIG. 1. FIG. 3 is a cross-sectional view of the circuit module 100, taken along the line III-III in FIG. 2.

The circuit module 100 includes a flat substrate 10, first electronic components 17, second electronic components 18, a frame substrate 20, a first sealing member 30, and a second sealing member 40.

The flat substrate 10 includes an electrically insulating layer 11, pattern conductors 12, and via conductors 13. The electrically insulating layer 11 contains an electrically insulating material that is selected from among ceramic materials and composite materials. Examples of the ceramic materials include Ba—Al—Si-based oxides. Examples of the composite materials include ones containing a woven fabric or nonwoven fabric of glass, silica, or the like, and an electrically insulating resin, such as epoxy resin. The pattern conductors 12 and the via conductors 13 contain a metal material, such as Cu.

A plurality of first connection electrodes 14 are disposed at a peripheral portion of one main surface 10F (the lower surface side in FIG. 3) of the flat substrate 10. A plurality of third connection electrodes 15 are disposed near a center portion of the one main surface 10F of the flat substrate 10. The first electronic components 17 are connected to the third connection electrodes 15 via second connection members J2. The first electronic components 17 are sealed inside the first sealing member 30 formed on the one main surface 10F of the flat substrate 10.

The first connection electrodes 14 and the third connection electrodes 15 contain a metal material, such as Cu. The first electronic components 17 are selected as needed from among passive components, such as capacitors, and active components, such as integrated circuits. The first sealing member 30 contains an electrically insulating photo-curing resin material (described later). Since the photo-curing resin material is used, the shape of the first sealing member 30 is controlled with high precision. For example, fine particles of a glass material, fine particles of an Si oxide, or the like, may be dispersed in the first sealing member 30 as fillers. For example, an Sn—Ag—Cu-based Pb-free solder material, or the like, is used as the second connection members J2.

A plurality of fourth connection electrodes 16 are disposed near a center portion on the other main surface 10S (the upper surface side in FIG. 3) of the flat substrate 10. The second electronic components 18 are connected to the fourth connection electrodes 16 via third connection members J3. The second electronic components 18 are sealed inside the second sealing member 40 formed on the other main surface 10S of the flat substrate 10.

The fourth connection electrodes 16 contain a metal material, such as Cu. The second electronic components 18, as well as the first electronic components 17, are selected from among various electronic components as needed. The second sealing member 40 contains an electrically insulating thermosetting resin material. The second sealing member 40 may contain an electrically insulating photo-curing resin material. For example, fine particles of a glass material, fine particles of an Si oxide, or the like, may be dispersed in the second sealing member 40 as fillers as well.

A solder material, or the like, similar to that of the second connection members J2 is used as the third connection members J3. The second connection members J2 and the third connection members J3 may be made of the same solder material or may be made of different solder materials.

The frame substrate 20 includes an electrically insulating layer 21 and via conductors 23. The electrically insulating layer 21 contains an electrically insulating material similar to that of the electrically insulating layer 11 of the flat substrate 10. The via conductors 23 contain a metal material, such as Cu. Although the frame substrate 20 has a single endless ring-shaped window frame shape in the circuit module 100, the frame substrate 20 may be, for example, a combination of two L-shaped substrates or a combination of two angular C-shaped substrates.

A plurality of second connection electrodes 24 are disposed on one main surface 20F (the upper surface side in FIG. 3) of the frame substrate 20 at locations corresponding to the first connection electrodes 14. A plurality of fifth connection electrodes 29 are disposed on the other main surface 20S (the lower surface side in FIG. 3) of the frame substrate 20. The fifth connection electrodes 29 are connection electrodes that are connected to input/output electrodes and grounding electrodes of a circuit board (not shown) of an electronic device. The second connection electrodes 24 and the fifth connection electrodes 29 contain a metal material, such as Cu.

Each of the first connection electrodes 14 and a corresponding one of the second connection electrodes 24 are connected to each other via a first connection member J1. The first electronic components 17 and the first sealing member 30 are located in a cavity C defined by the one main surface 10F of the flat substrate 10 and an inner surface 20I of the frame substrate 20. The first sealing member 30 is separated from the inner surface 20I of the frame substrate 20.

The first connection members J1 contain a metal material having a melting point of 900 degrees C. or higher. The metal material is, for example, a sintered body of Ag nanoparticle paste. The thus configured first connection members J1 do not remelt at the time of reflowing, and also has high breaking strength, so the electrical and mechanical connections between the flat substrate 10 and the frame substrate 20 are highly reliable.

In the circuit module 100, the frame substrate 20 and the first sealing member 30 are not in contact with each other. For this reason, at the time when the first sealing member 30 is cured or at the time when the circuit module 100 is connected to a circuit board of an electronic device by reflowing, no shear stress caused by the action described in the section Technical Problem develops between the flat substrate 10 and the frame substrate 20. Therefore, the first connection members J1 between the flat substrate 10 and the frame substrate 20 do not break, and the electrical and mechanical connections between the flat substrate 10 and the frame substrate 20 are highly reliable.

Manufacturing Method for Circuit Module

An example of a manufacturing method for the circuit module 100 that is the first embodiment of the circuit module according to the disclosure will be described with reference to FIG. 4A to FIG. 6B. FIG. 4A to FIG. 6B are cross-sectional views that respectively schematically show relevant portions of the processes that are sequentially performed in the example of the manufacturing method for the circuit module 100. Each of the drawings of FIG. 4A to FIG. 6B corresponds to the cross-sectional view of the circuit module 100, taken along the line III-III in FIG. 2 (see FIG. 3) (this also applies to the following cross-sectional views).

Figure 4A:
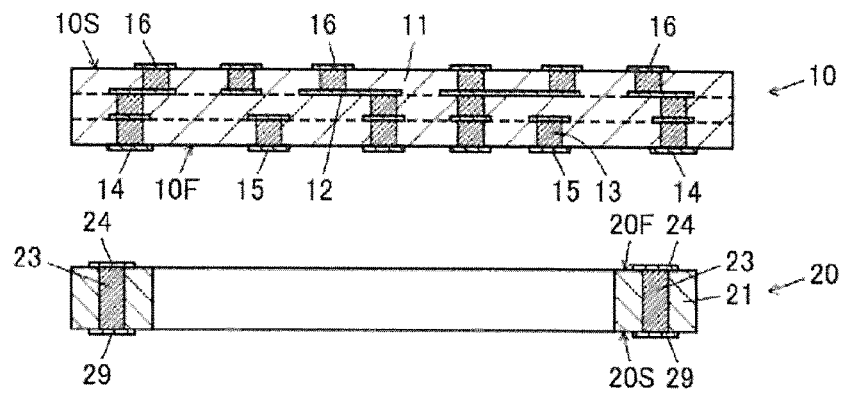
FIG. 4A is a view for illustrating an example of a manufacturing method for the circuit module 100, and is a cross-sectional view that schematically shows a making or preparation process (first process) for a flat substrate 10 and a frame substrate 20.

Making or Preparation Process (First Process) for Flat Substrate and Frame Substrate FIG. 4A is a cross-sectional view that schematically shows a making or preparation process (first process) for the flat substrate 10 and the frame substrate 20. In the first process, the flat substrate 10 having a desired shape and configuration and the frame substrate 20 having a desired shape and configuration are made. Alternatively, when at least one of the flat substrate 10 and the frame substrate 20 is already available, the at least one may be used for preparation. Since the description of the structures of the flat substrate 10 and frame substrate 20 has been already made in the section on the structure of the circuit module 100, the description thereof is omitted here.

Connection Process for Second Electronic Components

Figure 4B:
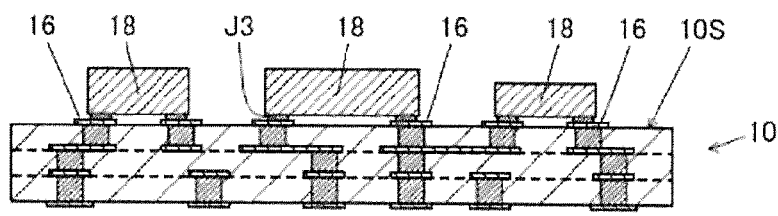
FIG. 4B is a view for illustrating an example of the manufacturing method for the circuit module 100, and is a cross-sectional view that schematically shows a connection process for second electronic components 18.

FIG. 4B is a cross-sectional view that schematically shows a connection process for the second electronic components 18.

In this process, the second electronic components 18 are connected via the third connection members J3 to the fourth connection electrodes 16 disposed on the other main surface 10S (the upper surface side in FIG. 4B) of the flat substrate 10. When the second electronic components 18 are unnecessary, this process is not performed.

Forming Process for Second Sealing Member

Figure 4C:
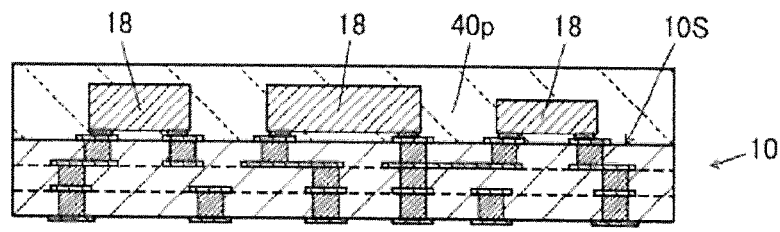
FIG. 4C is a view for illustrating an example of the manufacturing method for the circuit module 100, and is a cross-sectional view that schematically shows a forming process for a second sealing member 40.
Figure 4D:
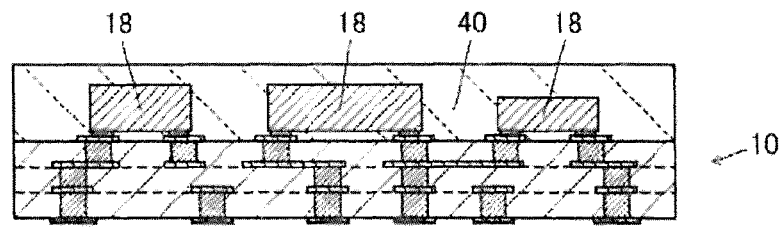
FIG. 4D is a view for illustrating an example of the manufacturing method for the circuit module 100, and is a cross-sectional view that schematically shows a forming process for the second sealing member 40.

FIG. 4C and FIG. 4D are cross-sectional views that schematically show a forming process for the second sealing member 40. In this process, the second electronic components 18 connected to the fourth connection electrodes 16 are sealed by the second sealing member 40. When no second electronic component 18 is connected to the flat substrate 10, this process is not performed. Even when the second electronic components 18 are connected to the flat substrate 10, this process may not be performed.

FIG. 4C shows a state where a precursor 40p for the second sealing member 40 is put on the other main surface 10S of the flat substrate 10 such that the second electronic components 18 are buried in the precursor 40p. The precursor 40p may be any one of a photo-curing one and a thermosetting one, and a curing property does not matter. FIG. 4D shows a state where the precursor 40p is cured by exposure to light having a predetermined wavelength or by heating into the second sealing member 40 that seals the second electronic components 18.

Connection Process (Second Process) for First Electronic Components

Figure 5A:
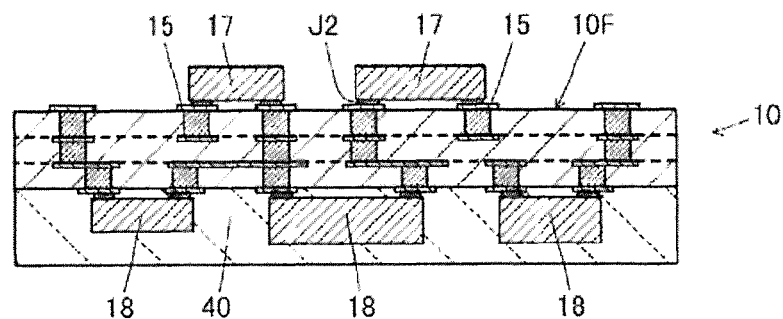
FIG. 5A is a view for illustrating an example of the manufacturing method for the circuit module 100, and is a cross-sectional view that schematically shows a connection process (second process) for first electronic components 17.

FIG. 5A is a cross-sectional view that schematically shows a connection process (second process) for the first electronic components 17. In this process, the flat substrate 10 on which the second sealing member 40 is formed is turned upside down, and the first electronic components 17 are connected via the second connection members J2 to the third connection electrodes 15 disposed on the one main surface 10F (the upper surface side in FIG. 5A) of the flat substrate 10.

Forming Process (Third Process) for First Sealing Member

Figure 5B:
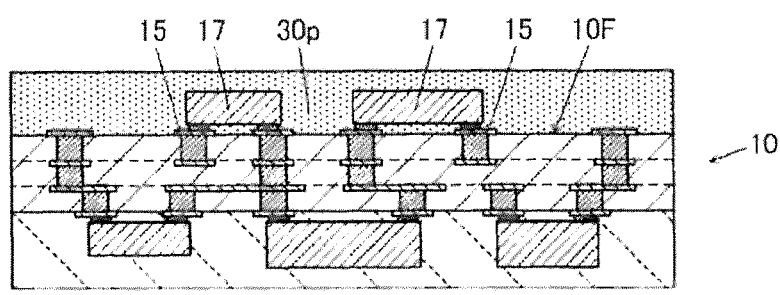
FIG. 5B is a view for illustrating an example of the manufacturing method for the circuit module 100, and is a cross-sectional view that schematically shows a forming process (third process) for a first sealing member 30.
Figure 5C:
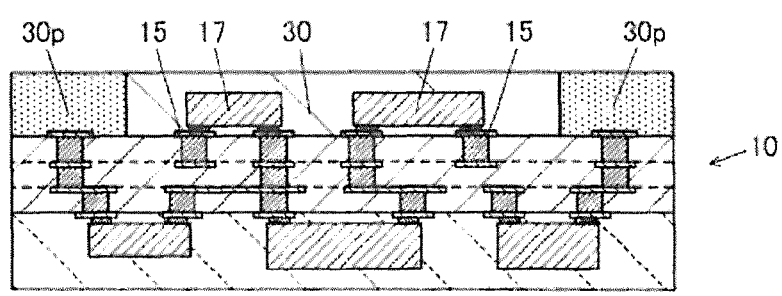
FIG. 5C is a view for illustrating an example of the manufacturing method for the circuit module 100, and is a cross-sectional view that schematically shows the forming process (third process) for the first sealing member 30.
Figure 5D:
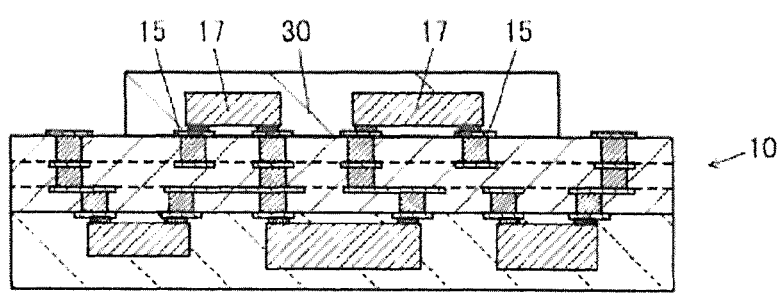
FIG. 5D is a view for illustrating an example of the manufacturing method for the circuit module 100, and is a cross-sectional view that schematically shows the forming process (third process) for the first sealing member 30.

FIG. 5B to FIG. 5D are cross-sectional views that schematically show a forming process for the first sealing member 30. In this process, the first electronic components 17 connected to the third connection electrodes 15 are sealed by the first sealing member 30.

FIG. 5B shows a sub-process of putting a photo-curing precursor 30p for the first sealing member 30 on the one main surface 10F of the flat substrate 10 such that the first electronic components 17 are buried in the precursor 30p. FIG. 5C and FIG. 5D show a sub-process of forming the first sealing member 30 having a predetermined shape by exposing the photo-curing precursor 30p for the first sealing member 30 to light.

FIG. 5C shows a state where a region of the photo-curing precursor 30p around the first electronic components 17 is cured by exposure to light having the predetermined wavelength through a mask pattern (not shown) having a predetermined open portion and the first sealing member 30 before development is obtained. FIG. 5D shows a state where the first sealing member 30 is developed by removing the uncured photo-curing precursor 30p and the first sealing member 30 that seals the first electronic components 17 with the predetermined shape is formed.

The photo-curing precursor 30p may be any one of a negative type (an exposed portion is left after development) and a positive type (a non-exposed portion is left after development). Any one of a negative-type mask pattern and a positive-type mask pattern is selected depending on the curing property of the photo-curing precursor 30p. Thus, the first sealing member 30 having the predetermined shape is formed. The predetermined shape means a shape that, when the frame substrate 20 is connected to the one main surface 10F of the flat substrate 10, the first sealing member 30 is separated from the inner surface 20I of the frame substrate 20.

Connection Process (Fourth Process) for Frame Substrate

Figure 6A:
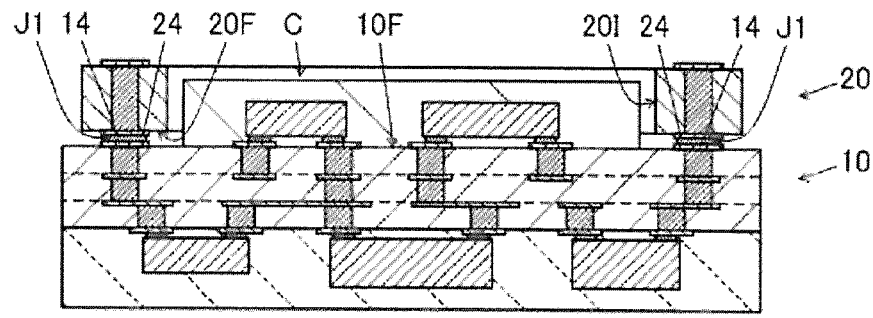
FIG. 6A is a view for illustrating an example of the manufacturing method for the circuit module 100, and is a cross-sectional view that schematically shows a connection process (fourth process) for the frame substrate 20.

FIG. 6A is a cross-sectional view that schematically shows a connection process (fourth process) for the frame substrate 20. In this process, each of the first connection electrodes 14 deposed at the peripheral portion of the one main surface 10F (the upper surface side in FIG. 6A) of the flat substrate 10 and a corresponding one of the second connection electrodes 24 disposed on the one main surface 20F (the lower surface side in FIG. 6A) of the frame substrate 20 are connected to each other via the first connection member J1. The first connection member J1 is, for example, a sintered body of Ag nanoparticle paste, as described above. Thus, the cavity C defined by the one main surface 10F of the flat substrate 10 and the inner surface 20I of the frame substrate 20 is formed.

Figure 6B:
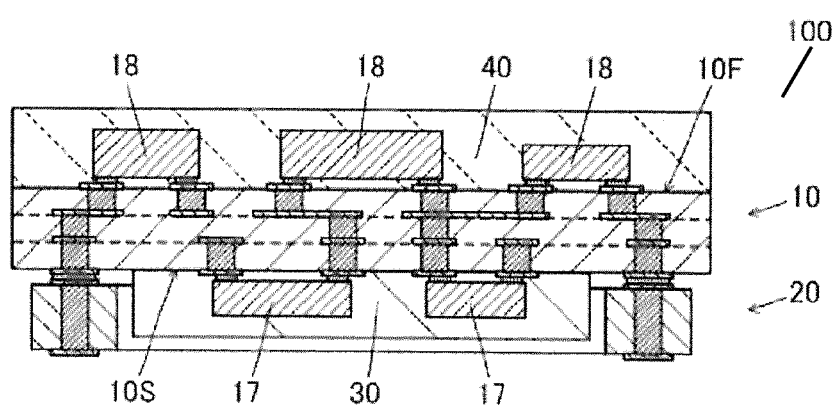
FIG. 6B is a view for illustrating an example of the manufacturing method for the circuit module 100, and is a cross-sectional view that schematically shows the completed circuit module 100.

FIG. 6B is a cross-sectional view that schematically shows a state where, after the completion of the processes described above, the circuit module 100 is finished by turning the product upside down. The first sealing member 30 that seals the first electronic components 17 is separated from the inner surface 20I of the frame substrate 20 in the cavity C.

Another Manufacturing Method for Circuit Module

In the manufacturing method for the circuit module 100, described above, the first electronic components 17 and the second electronic components 18 are connected to the singulated flat substrate 10, the first sealing member 30 and the second sealing member 40 are formed on the flat substrate 10, and the frame substrate 20 is connected to the flat substrate 10. On the other hand, the processes may be performed by using an aggregate flat substrate 10M.

Another example of the manufacturing method for the circuit module 100 that is the first embodiment of the circuit module according to the disclosure, that is, the case where the aggregate flat substrate 10M is used, will be described with reference to FIG. 7A to FIG. 7E. FIG. 7A to FIG. 7E are cross-sectional views that respectively schematically show relevant portions of the processes that are sequentially performed in another example of the manufacturing method for the circuit module 100.

Forming Process for Second Sealing Member

The description of a making or preparation process (first process) for the aggregate flat substrate 10M and the frame substrates 20 and the description of a connection process for the second electronic components 18 are omitted.

Figure 7A:
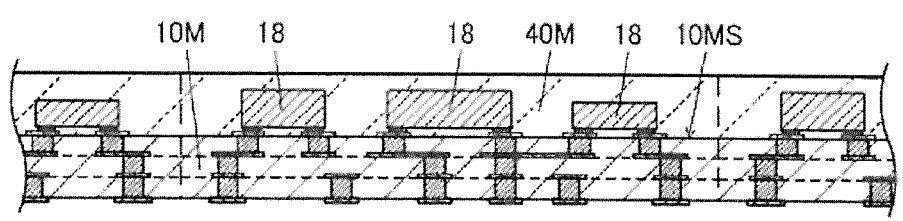
FIG. 7A is a view for illustrating an example of the manufacturing method for the circuit module 100, and is a cross-sectional view that schematically shows a forming process for a second sealing member 40M using an aggregate flat substrate 10M.

FIG. 7A is a cross-sectional view that schematically shows a forming process for the second sealing member 40M using the aggregate flat substrate 10M. In this process, the second sealing member 40M is formed on the other main surface 10MS of the aggregate flat substrate 10M, to which the second electronic components 18 are connected, so as to seal the second electronic components 18.

A forming method for the second sealing member 40M is similar to that of the forming process (FIG. 4C and FIG. 4D) for the second sealing member 40 in the above-described manufacturing method for the circuit module 100. Whether this process is required or not is similar to that of the above-described manufacturing method for the circuit module 100.

Forming Process (Third Process) for First Sealing Member

Figure 7B:
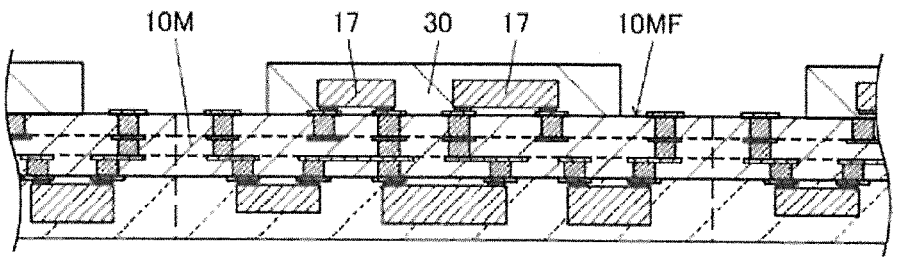
FIG. 7B is a view for illustrating another example of the manufacturing method for the circuit module 100, and is a cross-sectional view that schematically shows the forming process (third process) for the first sealing member 30.

The description of a connection process (second process) for the first electronic components 17 is omitted. FIG. 7B is a cross-sectional view that schematically shows a forming process (third process) for the first sealing member 30. In this process, a plurality of the first sealing members 30 are formed on one main surface 10MF of the aggregate flat substrate 10M, to which the first electronic components 17 are connected, so as to seal the first electronic components 17.

A forming method for the first sealing member 30 is similar to that of the forming process (FIG. 5B to FIG. 5D) for the first sealing member 30 in the above-described manufacturing method for the circuit module 100.

Connection Process (Fourth Process) for Frame Substrates

Figure 7C:
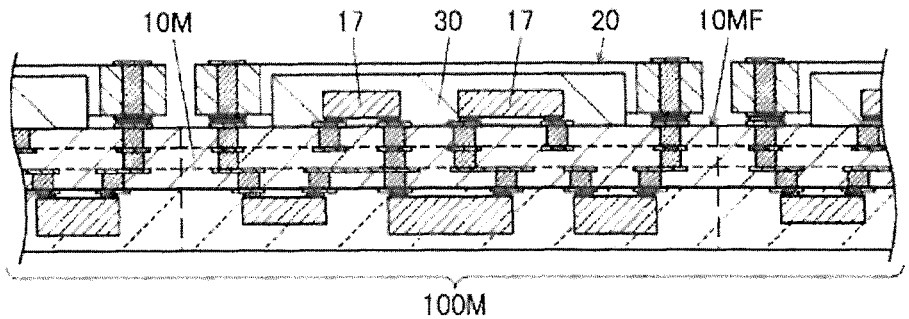
FIG. 7C is a view for illustrating another example of the manufacturing method for the circuit module 100, and is a cross-sectional view that schematically shows the connection process (fourth process) for the frame substrate 20.

FIG. 7C is a cross-sectional view that schematically shows a connection process (fourth process) for the frame substrates 20. In this process, a plurality of the frame substrates 20 are connected to the one main surface 10MF of the aggregate flat substrate 10M, and an aggregate circuit module 100M is manufactured. A method of connecting the frame substrates 20 to the aggregate flat substrate 10M is similar to that of the connection process (FIG. 6A) for the frame substrate in the above-described manufacturing method for the circuit module 100.

Singulating Process for Circuit Module Aggregate

Figure 7D:
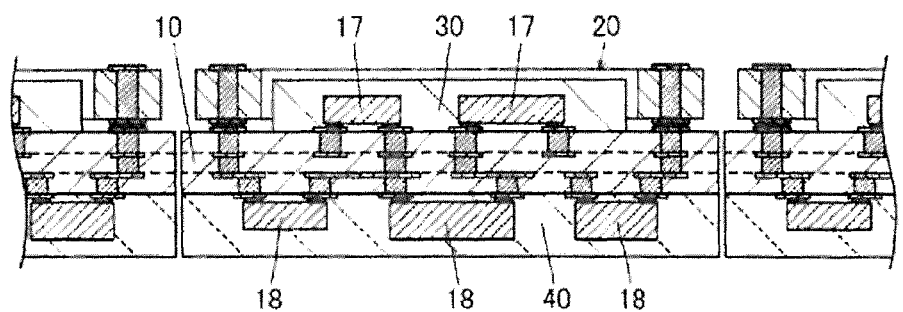
FIG. 7D is a view for illustrating another example of the manufacturing method for the circuit module 100, and is a cross-sectional view that schematically shows a singulating process for a completed circuit module 100M.
Figure 7E:
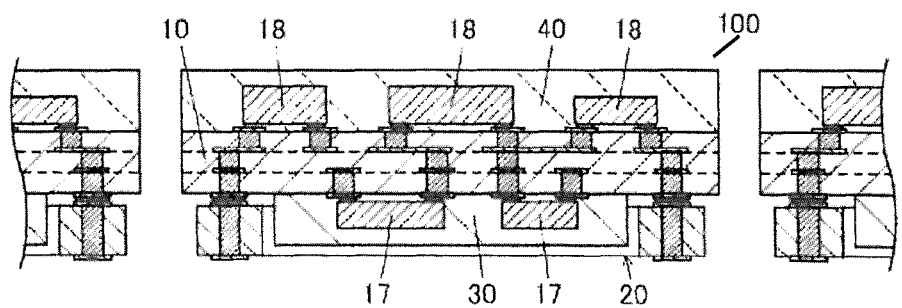
FIG. 7E is a view for illustrating another example of the manufacturing method for the circuit module 100, and is a cross-sectional view that schematically shows the completed circuit module 100.

FIG. 7D is a cross-sectional view that schematically shows a singulating process for the aggregate circuit module 100M. In this process, the aggregate circuit module 100M manufactured in the above-described processes is singulated into the separate circuit modules 100. Singulation of the aggregate circuit module 100M is performed by a known method, such as cutting with a dicing saw. FIG. 7E is a cross-sectional view that schematically shows a state where, after the processes described above are completed, the circuit modules 100 are finished by turning the products upside down.

Second Embodiment of Circuit Module

Structure of Circuit Module

The structure of a circuit module 100A that is a second embodiment of the circuit module according to the disclosure will be described with reference to FIG. 8. The circuit module 100A differs from the circuit module 100 in the material of a first sealing member 30A and a forming method for the first sealing member 30A. The other elements are in common with the circuit module 100, so the description of the common elements may be omitted.

Figure 8:
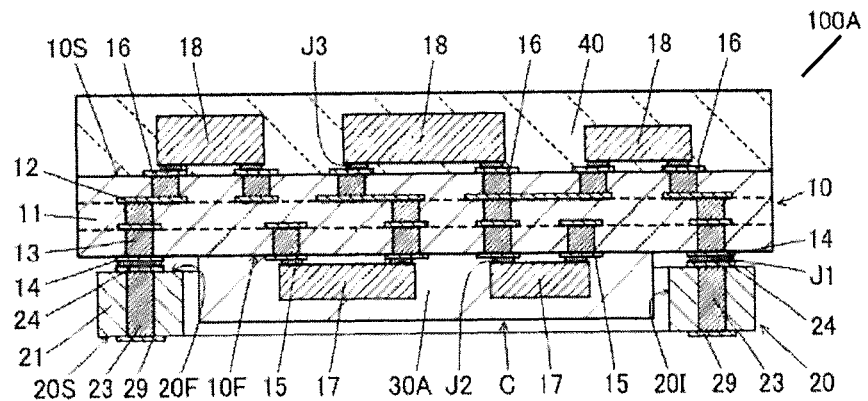
FIG. 8 is a cross-sectional view of a circuit module 100A that is a second embodiment of the circuit module according to the disclosure.

FIG. 8 is a cross-sectional view of the circuit module 100A. The circuit module 100A includes the flat substrate 10, the first electronic components 17, the second electronic components 18, the frame substrate 20, the first sealing member 30A, and the second sealing member 40.

In the circuit module 100A, the first sealing member 30A contains an electrically insulating thermosetting resin material. There are more kinds of electrically insulating thermosetting resin material than kinds of photo-curing resin material, and electrically insulating thermosetting resin materials are generally not expensive. Therefore, with the circuit module 100A, the cost for manufacturing a circuit module is kept low. As in the case of the circuit module 100, for example, fine particles of a glass material, fine particles of an Si oxide, or the like, may be dispersed in the first sealing member 30 as fillers.

Manufacturing Method for Circuit Module

An example of a manufacturing method for the circuit module 100A that is the second embodiment of the circuit module according to the disclosure will be described with reference to FIG. 9A to FIG. 10C. FIG. 9A to FIG. 10C are cross-sectional views that respectively schematically show relevant portions of the processes that are sequentially performed in the example of the manufacturing method for the circuit module 100A.

Connection Process (Second Process) for First Electronic Components

Figure 9A:
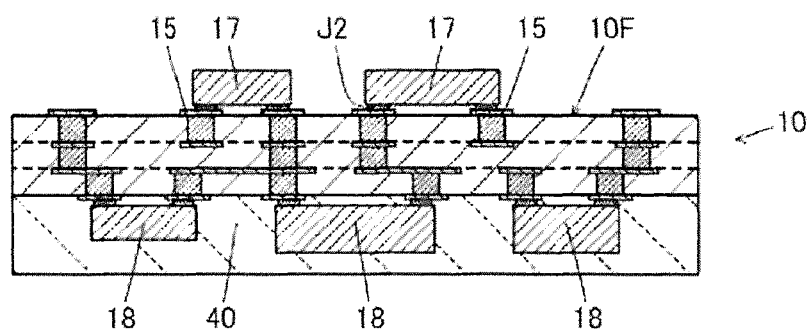
FIG. 9A is a view for illustrating an example of a manufacturing method for the circuit module 100A, and is a cross-sectional view that schematically shows a connection process (second process) for the first electronic components 17.

The description of a making or preparation process (first process) for the flat substrate 10 and the frame substrate 20, the description of a connection process for the second electronic components 18, and the description of the second sealing member 40 are omitted. FIG. 9A is a cross-sectional view that schematically shows a connection process (second process) for the first electronic components 17. In this process, the first electronic components 17 are connected via the second connection members J2 to the third connection electrodes 15 disposed on the one main surface 10F (the upper surface side in FIG. 9A) of the flat substrate 10.

Forming Process (Third Process) for First Sealing Member

FIG. 9B to FIG. 10C are cross-sectional views that schematically show a forming process (third process) for the first sealing member 30A. In this process, the first electronic components 17 connected to the third connection electrodes 15 are sealed by the first sealing member 30A.

Figure 9B:
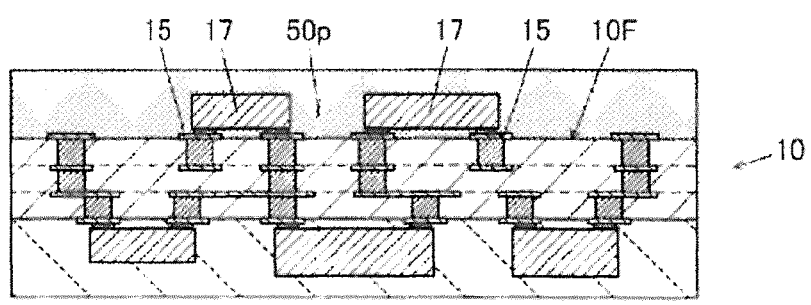
FIG. 9B is a view for illustrating an example of the manufacturing method for the circuit module 100A, and is a cross-sectional view that schematically shows a part of a forming process (third process) for the first sealing member 30.
Figure 9C:
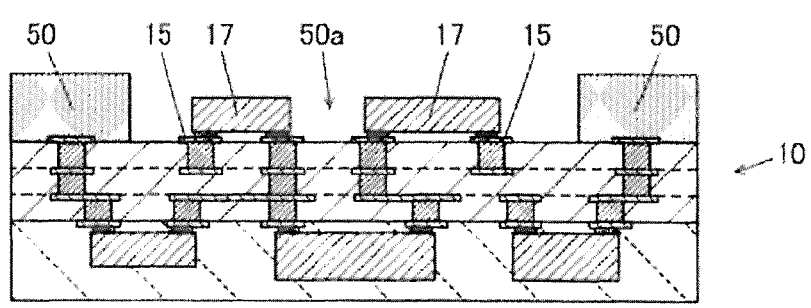
FIG. 9C is a view for illustrating an example of the manufacturing method for the circuit module 100A, and is a cross-sectional view that schematically shows a part of the forming process (third process) for the first sealing member 30.

FIG. 9B shows a sub-process of putting a photo-curing precursor 50p for a resist member 50 on the one main surface 10F of the flat substrate 10. A known material may be used as the photo-curing precursor 50p. FIG. 9C shows a sub-process of forming the resist member 50 having a predetermined open portion 50a, through which the first electronic components 17 are exposed, by exposure to light having a predetermined wavelength through a mask pattern (not shown) having a predetermined open portion and removal of the uncured photo-curing precursor 50p.

The photo-curing precursor 50p may be any one of a negative type and a positive type. An open portion having the predetermined shape is formed by selecting any one of a negative-type mask pattern and a positive-type mask pattern depending on the curing property of the photo-curing precursor 50p. The predetermined shape means a shape that the first sealing member 30A that is formed by being filled in the open portion 50a is separated from the inner surface 20I of the frame substrate 20 when the frame substrate 20 is connected to the one main surface 10F of the flat substrate 10.

Figure 9D:
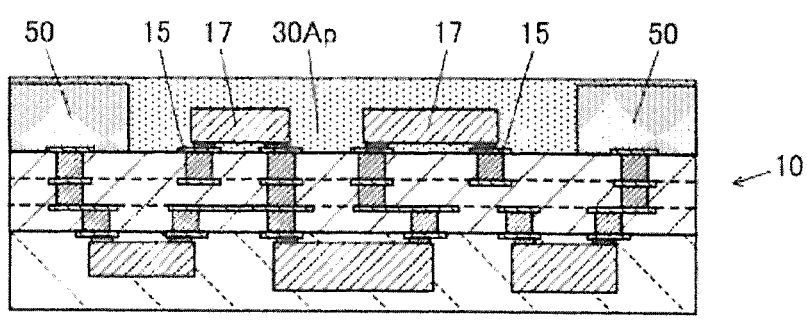
FIG. 9D is a view for illustrating an example of the manufacturing method for the circuit module 100A, and is a cross-sectional view that schematically shows a part of the forming process (third process) for the first sealing member 30.

FIG. 9D shows a sub-process of putting a thermosetting precursor 30Ap for the first sealing member 30A on the one main surface 10F of the flat substrate 10 on which the resist member 50 is provided. In this sub-process, the thermosetting precursor 30Ap is filled in the open portion 50a. If the thickness of the first sealing member 30A is adjusted later, the thermosetting precursor 30Ap is put so as to cover the resist member 50. On the other hand, when the thickness of the first sealing member 30A is not adjusted, the thermosetting precursor 30Ap is put so as to be flush with the resist member 50.

Figure 10A:
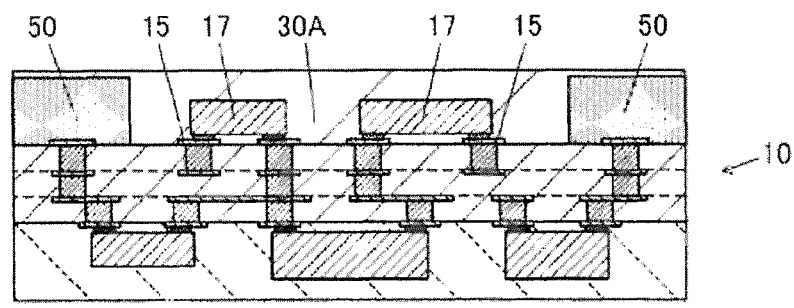
FIG. 10A is a view for illustrating an example of the manufacturing method for the circuit module 100A, and is a cross-sectional view that schematically shows another part of the forming process (third process) for the first sealing member 30.
Figure 10B:
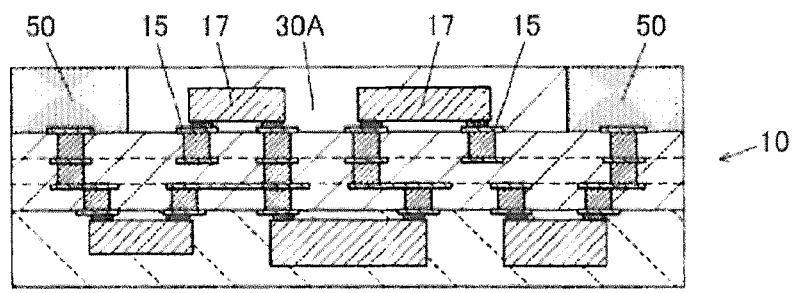
FIG. 10B is a view for illustrating an example of the manufacturing method for the circuit module 100A, and is a cross-sectional view that schematically shows another part of the forming process (third process) for the first sealing member 30.

FIG. 10A and FIG. 10B show a sub-process of forming the first sealing member 30A having the predetermined shape by heating the thermosetting precursor 30Ap. FIG. 10A shows a state where the thermosetting precursor 30Ap is cured by heating into the first sealing member 30A. FIG. 10B shows a state where the thickness of the first sealing member 30A is adjusted by, for example, grinding and the first sealing member 30A having the predetermined thickness and a flat outer surface is obtained. As described above, adjustment of the thickness of the first sealing member 30A is a process that is performed as needed, and is not an indispensable process.

Figure 10C:
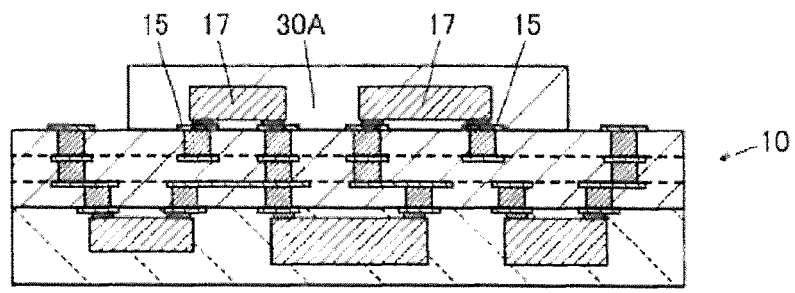
FIG. 10C is a view for illustrating an example of the manufacturing method for the circuit module 100A, and is a cross-sectional view that schematically shows another part of the forming process (third process) for the first sealing member 30.

FIG. 10C shows a sub-process of peeling the resist member 50 from the one main surface 10A of the flat substrate 10. In this sub-process, the first sealing member 30A that has the predetermined shape and that seals the first electronic components 17 is formed on the one main surface 10A of the flat substrate 10. After that, through a connection process (fourth process) for the frame substrate 20, the circuit module 100A is finished. The connection process for the frame substrate 20 is similar to that of the manufacturing method for the circuit module 100, so the description thereof is omitted.

Third Embodiment of Circuit Module

Structure of Circuit Module

The structure of a circuit module 100B that is a third embodiment of the circuit module according to the disclosure will be described with reference to FIG. 11. The circuit module 100B differs from the circuit module 100 in the material of first connection members J1A and a forming method for the first connection members J1A. The other elements are in common with the circuit module 100, so the description of the common elements may be omitted.

Figure 11:
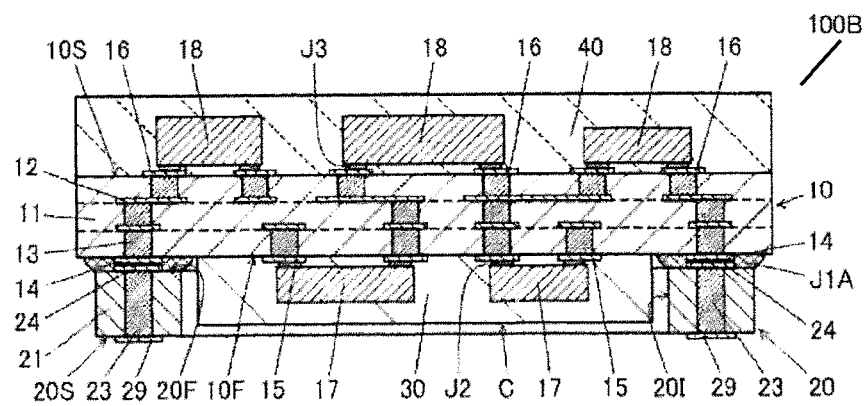
FIG. 11 is a cross-sectional view of a circuit module 100B that is a third embodiment of the circuit module according to the disclosure.

FIG. 11 is a cross-sectional view of the circuit module 100B. The basic elements of the circuit module 100B are similar to those of the circuit module 100.

In the circuit module 100B, the first connection members J1A contain an anisotropic conductive resin material, and each seal a corresponding one of the first connection electrodes 14 and a corresponding one of the second connection electrodes 24. A state where the first connection members J1A each seal a corresponding one of the first connection electrodes 14 and a corresponding one of the second connection electrodes 24 means a state where the first connection members J1A each are in contact with both the one main surface 10F of the flat substrate 10 and the one main surface 20F of the frame substrate 20 and cover an exposed surface of a corresponding one of the first connection electrodes 14 and an exposed surface of a corresponding one of the second connection electrodes 24.

That is, in the circuit module 100B, the first connection members J1A each are a conductive region between a corresponding one of the first connection electrodes 14 and a corresponding one of the second connection electrodes 24 due to the mutual contact of conductive fillers. In addition, the first connection members J1A each also serve as an underfill between the one main surface 10F of the flat substrate 10 and the one main surface 20F of the frame substrate 20. In other words, the first connection members each not only electrically connect a corresponding one of the first connection electrodes and a corresponding one of the second connection electrodes to each other but also mechanically connect the flat substrate and the frame substrate to each other. Therefore, the electrical and mechanical connections between the flat substrate and the frame substrate are further highly reliable.

Manufacturing Method for Circuit Module

An example of a manufacturing method for the circuit module 100B that is the third embodiment of the circuit module according to the disclosure will be described with reference to FIG. 12A to FIG. 12D. FIG. 12A to FIG. 12D are cross-sectional views that respectively schematically show relevant portions of the processes that are sequentially performed in the example of the manufacturing method for the circuit module 100B.

Connection Process (Fourth Process) for Frame Substrate

Figure 12A:
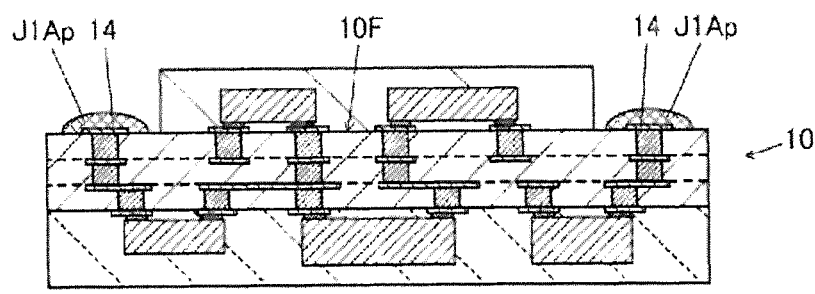
FIG. 12A is a view for illustrating an example of a manufacturing method for the circuit module 100B, and is a cross-sectional view that schematically shows a connection process (fourth process) for the frame substrate 20.
Figure 12B:
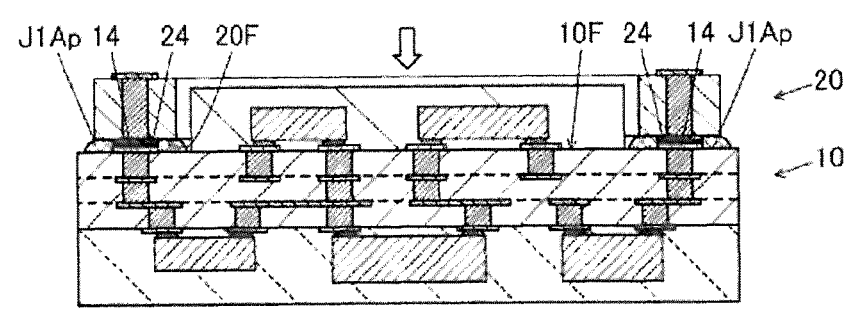
FIG. 12B is a view for illustrating an example of the manufacturing method for the circuit module 100B, and is a cross-sectional view that schematically shows the connection process (fourth process) for the frame substrate 20.
Figure 12C:
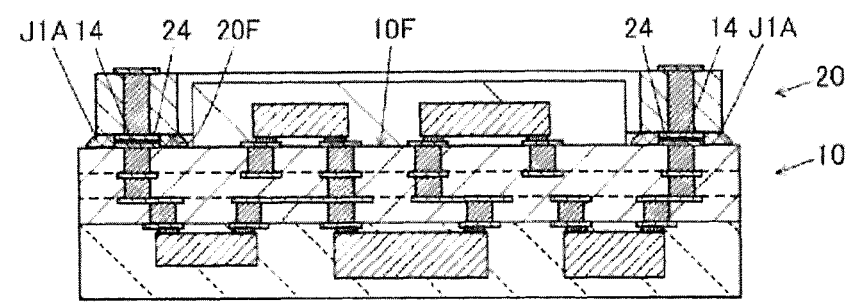
FIG. 12C is a view for illustrating an example of the manufacturing method for the circuit module 100B, and is a cross-sectional view that schematically shows the connection process (fourth process) for the frame substrate 20.

The description of a making or preparation process (first process) for the flat substrate 10 and the frame substrate 20 to the description of a forming process (third process) for the first sealing member 30 are omitted. FIG. 12A to FIG. 12C are cross-sectional views that schematically show a connection process (fourth process) for the frame substrate 20. In this process, the one main surface 10F (the upper surface side in FIG. 12B) of the flat substrate 10 and the one main surface 20F (the lower surface side in FIG. 12B) of the frame substrate 20 are connected to each other via the first connection members J1A.

The first connection members J1A, as described above, contain an anisotropic conductive resin material, and each seal a corresponding one of the first connection electrodes 14 and a corresponding one of the second connection electrodes 24. FIG. 12A shows a sub-process of putting liquid resin J1Ap containing an uncured anisotropic conductive resin material on the first connection electrodes 14. The liquid resin J1Ap may be put on the second connection electrodes 24, or may be put on both the first connection electrodes 14 and the second connection electrodes 24.

FIG. 12B shows a sub-process of pressurizing the liquid resin J1Ap between each of the first connection electrodes 14 and a corresponding one of the second connection electrodes 24 and additionally burying each of the first connection electrodes 14 and a corresponding one of the second connection electrodes 24 in the liquid resin by facing each of the first connection electrodes 14 and a corresponding one of the second connection electrodes 24 to each other with the liquid resin J1Ap interposed therebetween and relatively displacing each of the first connection electrodes 14 and a corresponding one of the second connection electrodes 24 in a direction to approach each other (the arrow direction).

Since the liquid resin J1Ap contains an uncured anisotropic conductive resin material, the conductive fillers mutually contact with each other in the pressurized region, with the result that the liquid resin J1Ap has electrical conductivity. Although each of the first connection electrodes 14 and a corresponding one of the second connection electrodes 24 are buried in the liquid resin J1Ap as a result of the pressurization, almost no pressure is applied to a region surrounding each of the first connection electrodes 14 and a corresponding one of the second connection electrodes 24 between the one main surface 10F of the flat substrate 10 and the one main surface 20F of the frame substrate 20, so the liquid resin J1Ap in this region is electrically insulated.

Figure 12D:
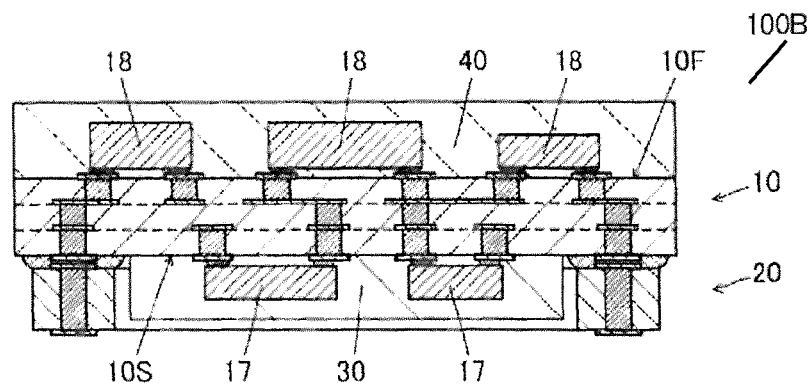
FIG. 12D is a view for illustrating an example of the manufacturing method for the circuit module 100B, and is a cross-sectional view that schematically shows the completed circuit module 100B.

FIG. 12C shows a sub-process of forming the first connection members J1A cured by heating the liquid resin J1Ap. The first connection members J1A each electrically connect a corresponding one of the first connection electrodes 14 and a corresponding one of the second connection electrodes 24 to each other and seal a corresponding one of the first connection electrodes 14 and a corresponding one of the second connection electrodes 24. Through the above-described processes, the first connection members J1A are formed. The first connection members J1A each have a conductive region that electrically connects the connection electrodes to each other and an electrically insulating region that mechanically connects the one main surface 10F of the flat substrate 10 and the one main surface 20F of the frame substrate 20 to each other as an underfill. FIG. 12D is a cross-sectional view that schematically shows a state where, after the completion of the above-described processes, the circuit module 100B is finished by turning the product upside down.

Fourth Embodiment of Circuit Module

Structure of Circuit Module

The structure of a circuit module 100C that is a fourth embodiment of the circuit module according to the disclosure will be described with reference to FIG. 13. The circuit module 100C differs from the circuit module 100 in the material of first connection members J1B and a forming method for the first connection members J1B, and includes electrically insulating resin members J1C. The other elements are in common with the circuit module 100, so the description of the common elements may be omitted.

Figure 13:
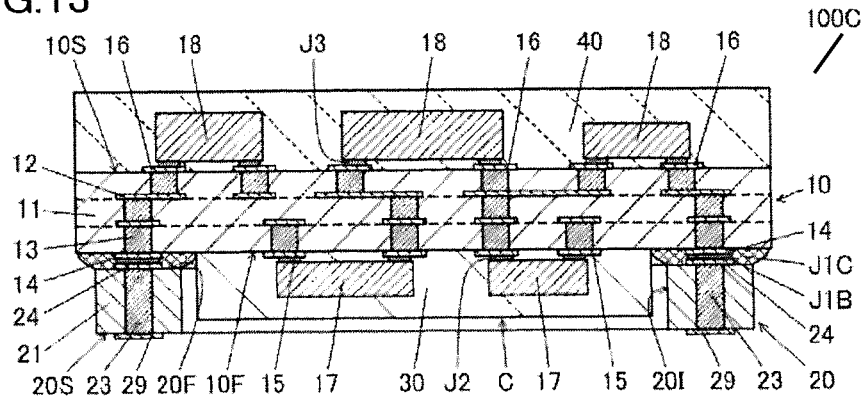
FIG. 13 is a cross-sectional view of a circuit module 100C that is a fourth embodiment of the circuit module according to the disclosure.

FIG. 13 is a cross-sectional view of the circuit module 100C. The basic elements of the circuit module 100C are similar to those of the circuit module 100.

In the circuit module 100C, the first connection members J1B contain a metal material containing Sn. Examples of the metal material containing Sn include an Sn—Ag—Cu-based Pb-free solder material. The electrically insulating resin members J1C each are disposed so as to seal a corresponding one of the first connection electrodes 14, a corresponding one of the second connection electrodes 24, and a corresponding one of the first connection members J1B. Therefore, the electrically insulating resin members J1C serve as an underfill between the one main surface 10F of the flat substrate 10 and the one main surface 20F of the frame substrate 20.

The electrically insulating resin members J1C contain an electrically insulating resin material, such as epoxy resin. For example, fine particles of a glass material, fine particles of an Si oxide, or the like, may be dispersed in the electrically insulating resin members J1C as fillers as well.

A state where the electrically insulating resin members J1C each seal a corresponding one of the first connection electrodes 14, a corresponding one of the second connection electrodes 24, and a corresponding one of the first connection members J1B means a state where the electrically insulating resin members J1C each are in contact with both the one main surface 10F of the flat substrate 10 and the one main surface 20F of the frame substrate 20 and cover an exposed surface of a corresponding one of the first connection electrodes 14, an exposed surface of a corresponding one of the second connection electrodes 24, and an exposed surface of a corresponding one of the first connection members J1B.

That is, in the circuit module 100C, each of the first connection members J1B that contain a metal material containing Sn plays a role in the electrical connection between a corresponding one of the first connection electrodes 14 and a corresponding one of the second connection electrodes 24. The electrically insulating resin members J1C each are disposed so as to seal a corresponding one of the first connection electrodes 14, a corresponding one of the second connection electrodes 24, and a corresponding one of the first connection members J1B. Therefore, the electrically insulating resin members J1C serve as an underfill between the one main surface 10F of the flat substrate 10 and the one main surface 20F of the frame substrate 20.

Since the first connection members J1B are made of a metal material, such as a Pb-free solder material containing Sn, the first connection members J1B have high electric conductivity and also have high breaking strength. The electrically insulating resin members J1C mechanically connect the flat substrate 10 and the frame substrate 20 to each other as an underfill. Therefore, with the circuit module 100C, the electrical and mechanical connections between the flat substrate and the frame substrate are further highly reliable.

Manufacturing Method for Circuit Module

An example of a manufacturing method for the circuit module 100C that is the fourth embodiment of the circuit module according to the disclosure will be described with reference to FIG. 14A to FIG. 14D. FIG. 14A to FIG. 14D are cross-sectional views that respectively schematically show relevant portions of the processes that are sequentially performed in the example of the manufacturing method for the circuit module 100C.

Connection Process (Fourth Process) for Frame Substrate

Figure 14A:
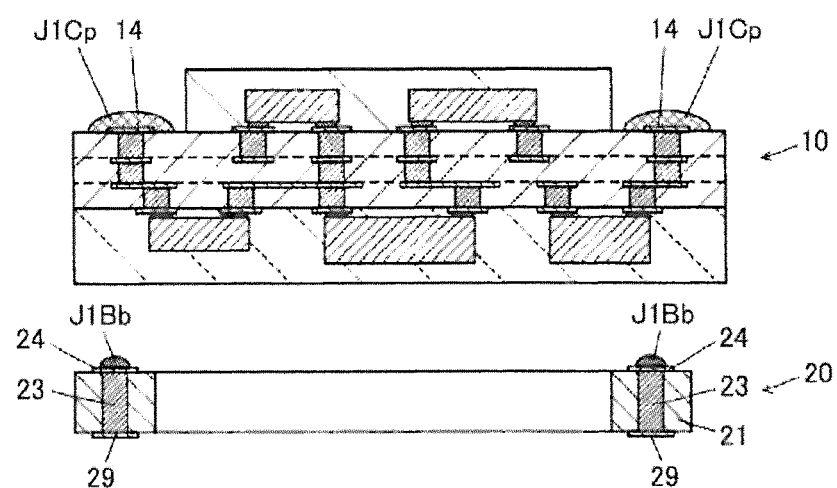
FIG. 14A is a view for illustrating an example of a manufacturing method for the circuit module 100C, and is a cross-sectional view that schematically shows the connection process (fourth process) for the frame substrate 20.
Figure 14B:
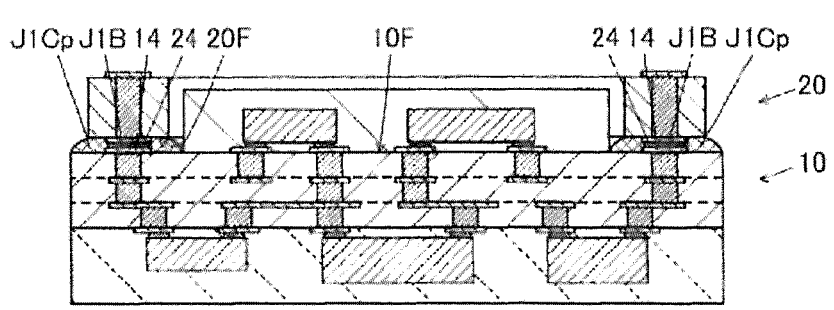
FIG. 14B is a view for illustrating an example of the manufacturing method for the circuit module 100C, and is a cross-sectional view that schematically shows the connection process (fourth process) for the frame substrate 20.
Figure 14C:
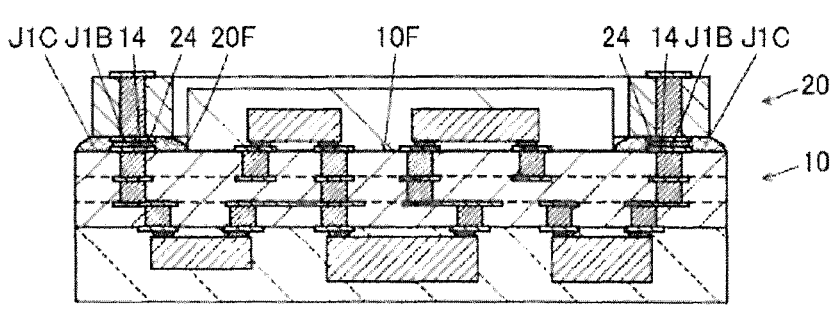
FIG. 14C is a view for illustrating an example of the manufacturing method for the circuit module 100C, and is a cross-sectional view that schematically shows the connection process (fourth process) for the frame substrate 20.

The description of a making or preparation process (first process) for the flat substrate 10 and the frame substrate 20 to the description of a forming process (third process) for the first sealing member 30 are omitted. FIG. 14A to FIG. 14C are cross-sectional views that schematically show a connection process (fourth process) for the frame substrate 20. In this process, the one main surface 10F (the upper surface side in FIG. 14B) of the flat substrate 10 and the one main surface 20F (the lower surface side in FIG. 14B) of the frame substrate 20 are connected to each other via the first connection members J1B and the electrically insulating resin members J1C.

The first connection members J1B, as described above, contain a metal material, such as Pb-free solder containing Sn. The electrically insulating resin members J1C, as described above, contain an electrically insulating resin material, such as epoxy resin in which fillers are dispersed.

FIG. 14A shows a sub-process of putting liquid resin J1Cp containing an uncured electrically insulating resin material on the first connection electrodes 14 and putting a metal material bump J1Bp made of Pb-free solder containing Sn on each of the second connection electrodes 24. Alternatively, the liquid resin J1Cp may be put on the second connection electrodes 24, and the metal material bump J1Bb may be put on each of the first connection electrodes 14.

FIG. 14B shows a sub-process of bringing each of the metal material bumps J1Bb put on the second connection electrodes 24 into contact with a corresponding one of the first connection electrodes 14 on which the liquid resin J1Cp is put, and burying each of the first connection electrodes 14, a corresponding one of the second connection electrodes 24, and a corresponding one of the metal material bumps J1Bb in the liquid resin J1Cp.

Figure 14D:
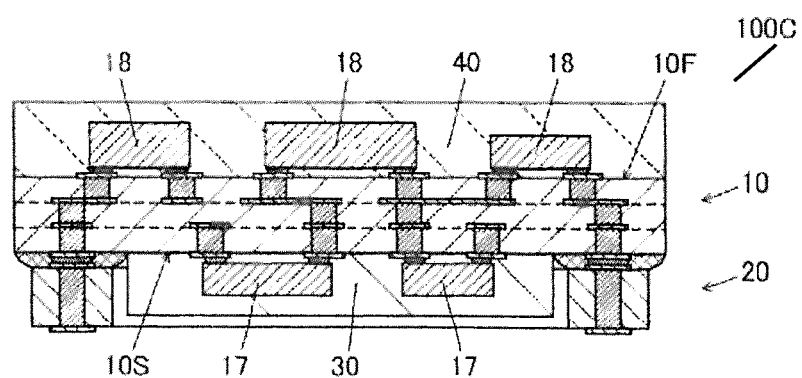
FIG. 14D is a view for illustrating an example of the manufacturing method for the circuit module 100C, and is a cross-sectional view that shows the completed circuit module 100C.

FIG. 14C shows a sub-process of forming the first connection members J1B by applying ultrasonic vibrations to the metal material bumps J1Bb, the first connection members J1B each electrically connecting a corresponding one of the first connection electrodes 14 and a corresponding one of the second connection electrodes 24 to each other, and forming the electrically insulating resin members J1C cured by heating the liquid resin J1Cp, the electrically insulating resin members J1C each sealing a corresponding one of the first connection electrodes 14, a corresponding one of the second connection electrodes 24, and a corresponding one of the first connection members J1B. FIG. 14D is a cross-sectional view that schematically shows a state where, after the completion of the above-described processes, the circuit module 100C is finished by turning the product upside down.

Fifth Embodiment of Circuit Module

Structure of Circuit Module

The structure of a circuit module 100D that is a fifth embodiment of the circuit module according to the disclosure will be described with reference to FIG. 15. The circuit module 100D differs from the circuit module 100 in that a metal film 31 is disposed on the surface of the first sealing member 30. The other elements are in common with the circuit module 100, so the description of the common elements may be omitted.

Figure 15:
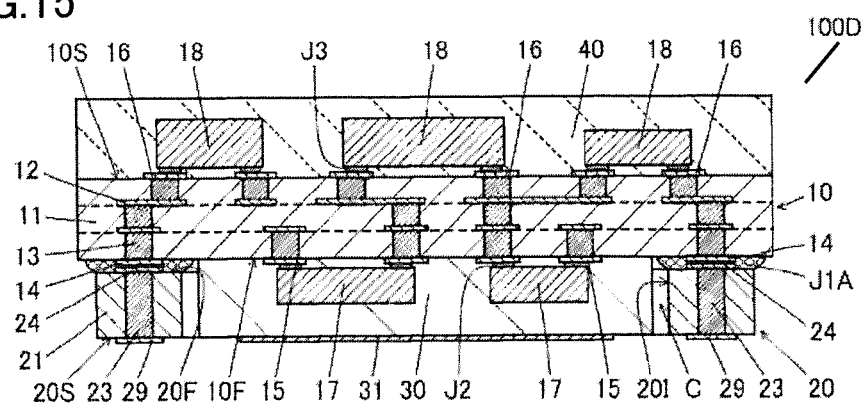
FIG. 15 is a cross-sectional view of a circuit module 100D that is a fifth embodiment of the circuit module according to the disclosure.

FIG. 15 is a cross-sectional view of the circuit module 100D. The basic elements of the circuit module 100D are similar to those of the circuit module 100.

In the circuit module 100D, the metal film 31 is disposed on a surface of the first sealing member 30 opposite to a surface of the first sealing member 30 facing to the one main surface 10F of the flat substrate 10. The metal film 31 contains a metal material, such as Ag and Cu. The metal film 31 may contain a binder, such as a resin material, as needed in addition to the metal material. The metal film 31 may be disposed so as to extend to the side surface of the first sealing member 30. In the circuit module 100D, the fifth connection electrodes (input/output electrodes and grounding electrodes) 29 and the metal film 31 are disposed so as to be flush with each other; however, the fifth connection electrodes 29 and the metal film 31 are not limited to this disposition.

The metal film 31 is connected to a connection electrode (not shown) on a circuit board of an electronic device together with the fifth connection electrodes 29 of the circuit module 100D at the time when the circuit module 100D is connected to the circuit board of the electronic device by reflowing. That is, the connection portions between the circuit module 100D and the circuit board of the electronic device increase as compared to the circuit module 100. Therefore, with the circuit module 100D, the mechanical connection is highly reliable.

In addition, it is possible to efficiently dissipate the heat to the circuit board of the electronic device through the metal film 31 when the heat is generated from the first electronic components 17 during the operation of the circuit module 100D. That is, the damage due to the self-heating of the first electronic components 17 is reduced. Therefore, the circuit module 100D has high lifetime reliability.

Manufacturing Method for Circuit Module

Figure 16A:
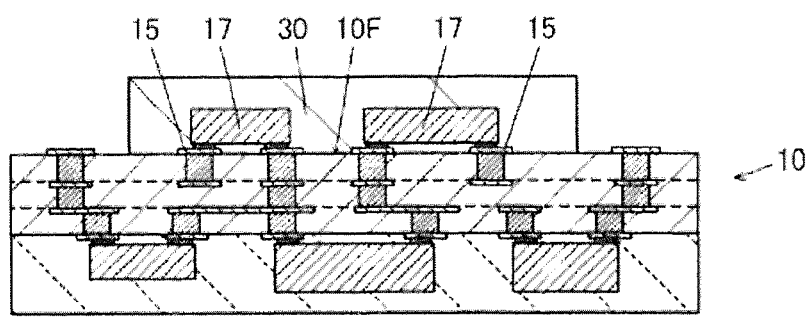
FIG. 16A is a view for illustrating an example of a manufacturing method for the circuit module 100D, and is a cross-sectional view that schematically shows a case where a metal film 31 is put on the surface of the first sealing member 30 in a forming process (third process) for the first sealing member 30.
Figure 16B:
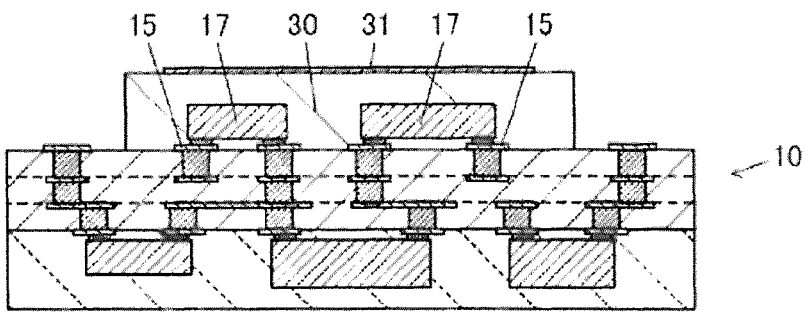
FIG. 16B is a view for illustrating an example of the manufacturing method for the circuit module 100D, and is a cross-sectional view that schematically shows a case where the metal film 31 is put on the surface of the first sealing member 30 in the forming process (third process) for the first sealing member 30.
Figure 16C:
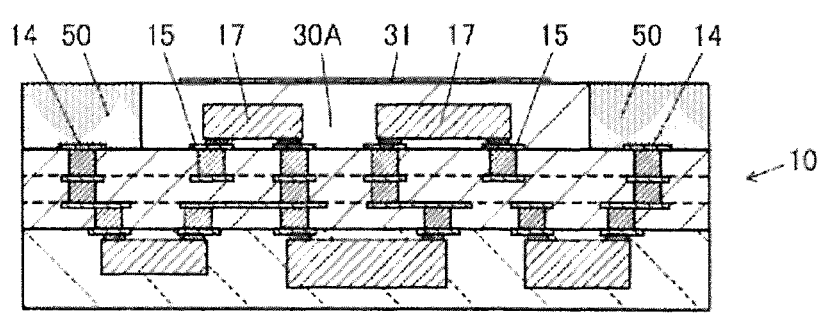
FIG. 16C is a view for illustrating an example of the manufacturing method for the circuit module 100D, and is a cross-sectional view that schematically shows a case where the metal film 31 is put on the surface of the first sealing member 30 in the forming process (third process) for the first sealing member 30.
Figure 17:
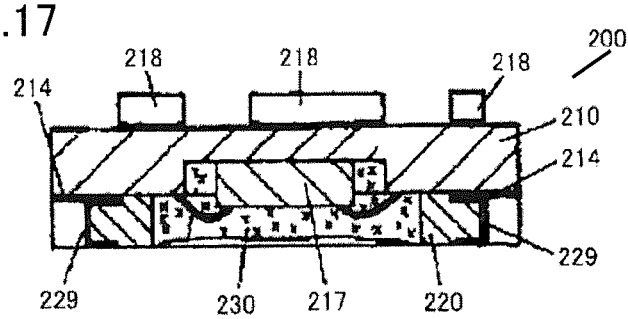
FIG. 17 is a cross-sectional view of a circuit module 200 of the related art.

An example of a manufacturing method for the circuit module 100D that is the fifth embodiment of the circuit module according to the disclosure will be described with reference to FIG. 16A to FIG. 16C. FIG. 16A to FIG. 16C are cross-sectional views that respectively schematically show relevant portions of the processes that are sequentially performed in the example of the manufacturing method for the circuit module 100D.

Forming Process (Third Process) for First Sealing Member Including Sub-process of Disposing Metal Film 31

The description of a making or preparation process (first process) for the flat substrate 10 and the frame substrate 20 to the description of a sub-process until the first sealing member 30 is formed within a forming process (third process) for the first sealing member 30 are omitted. FIG. 16A and FIG. 16B are cross-sectional views that schematically show a state where the metal film 31 is disposed on the surface of the first sealing member 30 in the forming process (third process) for the first sealing member 30.

In this process, the metal film 31 is disposed on a surface of the formed first sealing member 30 opposite to a surface of the first sealing member 30 facing to the one main surface 10F of the flat substrate 10.

FIG. 16A shows a state where, as in the case of the above-described manufacturing method for the circuit module 100, the first sealing member 30 made of a photo-curing resin is formed on the one main surface 10F of the flat substrate 10. As in the case of the manufacturing method for the circuit module 100A, the first sealing member 30A made of a thermosetting resin is formed on the one main surface 10F of the flat substrate 10.

FIG. 16B shows a sub-process of disposing the metal film 31 on the surface of the first sealing member 30 opposite to the surface of the first sealing member 30 facing to the one main surface 10F of the flat substrate 10. The metal film 31 is formed by screen printing using the metal material paste containing, for example, Ag particles and a resin material. Alternatively, the metal film 31 may be formed by a thin-film forming method, such as sputtering and vapor deposition, using, for example, Cu or an alloy containing Cu, as a base material.

The metal film 31 may be disposed on the surface of the first sealing member 30 by once making the photo-curing precursor 30p for the first sealing member 30 in a half-cured state, reprinting the metal film 31 formed in advance, and then curing the half-cured photo-curing precursor 30p into the first sealing member 30. Similarly, the metal film 31 may be disposed on the surface of the first sealing member 30A.

When the metal film 31 is disposed on the surface of the first sealing member 30A, the metal film 31 may be disposed on the surface of the first sealing member 30A before the resist member 50 is peeled, as shown in FIG. 16C. In this case, since the metal film 31 is disposed on the surface of the first sealing member 30A in a state where the resist member 50 and the first sealing member 30A are flush with each other, the formation, reprinting, or the like, of the metal film 31 is easily performed. Furthermore, since the metal film 31 is disposed on the surface of the first sealing member 30A in a state where the resist member 50 covers the first connection electrodes 14 and their surroundings, the first connection electrodes 14 and their surroundings are not contaminated by the components of the metal film 31.

The disclosure is not limited to the above-described embodiments, and may include various applications or modifications within the scope of the disclosure. The embodiments described in this specification are illustrative, and it is pointed out that, among the different embodiments, partial replacement or combination of the components is possible.

100, 100A, 100B, 100C, 100D circuit module
10 flat substrate
10F, 20F one main surface
10S, 20S other main surface
11 first electrically insulating layer
12 pattern conductor
13 first via conductor
14 first connection electrode
15 third connection electrode
16 fourth connection electrode
17 first electronic component
18 second electronic component
20 frame substrate
20I inner surface
21 second electrically insulating layer
23 second via conductor
24 second connection electrode
29 fifth connection electrode
30, 30A first sealing member
30Ap thermosetting precursor
30p, 50p photo-curing precursor
31 metal film
40 second sealing member
40p precursor
50 resist member
50a open portion
C cavity
J1, J1A, J1B first connection member
J1Bb metal material bump
J1C electrically insulating resin member
J2 second connection member
J3 third connection member

The invention claimed is:

1. A circuit module comprising:
a flat substrate having a plurality of first connection electrodes disposed at a peripheral portion of one main surface of the flat substrate;
a frame substrate having a plurality of second connection electrodes disposed on one main surface of the frame substrate at locations corresponding to the first connection electrodes;
a first electronic component; and
a first sealing member, wherein
each of the first connection electrodes and a corresponding one of the second connection electrodes are connected to each other via a first connection member,
the first electronic component is completely sealed by the first sealing member, and no portion of the first electronic component is exposed from the first sealing member,
the first electronic component and the first sealing member are disposed in a cavity defined by the one main surface of the flat substrate and an inner surface of the frame substrate, and
the first sealing member is separated from the inner surface of the frame substrate,
wherein the first connection member contains a metal material containing Sn, and the first connection member, a corresponding one of the first connection electrodes and a corresponding one of the second connection electrodes are sealed by an electrically insulating resin member.

2. The circuit module according to claim 1, wherein the first sealing member contains a photo-curing resin material.

3. The circuit module according to claim 2, wherein the first connection member contains a metal material having a melting point of 900 degrees C. or higher.

4. The circuit module according to claim 2, wherein the first connection member contains an anisotropic conductive resin material, and seals a corresponding one of the first connection electrodes and a corresponding one of the second connection electrodes.

5. The circuit module according to claim 2, wherein a metal film is disposed on a surface of the first sealing member opposite to a surface of the first sealing member facing to the one main surface of the flat substrate.

6. The circuit module according to claim 1, wherein the first connection member contains a metal material having a melting point of 900 degrees C. or higher.

7. The circuit module according to claim 6, wherein a metal film is disposed on a surface of the first sealing member opposite to a surface of the first sealing member facing to the one main surface of the flat substrate.

8. The circuit module according to claim 1, wherein the first connection member contains an anisotropic conductive resin material, and seals a corresponding one of the first connection electrodes and a corresponding one of the second connection electrodes.

9. The circuit module according to claim 8, wherein a metal film is disposed on a surface of the first sealing member opposite to a surface of the first sealing member facing to the one main surface of the flat substrate.

10. The circuit module according to claim 1, wherein a metal film is disposed on a surface of the first sealing member opposite to a surface of the first sealing member facing to the one main surface of the flat substrate.

* * * * *